United States Patent
Bar-Or Tillinger et al.

(10) Patent No.: US 12,289,163 B2
(45) Date of Patent: Apr. 29, 2025

(54) LOW DENSITY PARITY CHECK GRAPH ADAPTATION

(71) Applicant: QUALCOMM Incorporated, San Diego, CA (US)

(72) Inventors: Amit Bar-Or Tillinger, Tel-Aviv (IL); Shay Landis, Hod Hasharon (IL); Idan Michael Horn, Hod Hasharon (IL); Yehonatan Dallal, Kfar Saba (IL)

(73) Assignee: QUALCOMM Incorporated, San Diego, CA (US)

( * ) Notice: Subject to any disclaimer, the term of this patent is extended or adjusted under 35 U.S.C. 154(b) by 72 days.

(21) Appl. No.: 18/146,816

(22) Filed: Dec. 27, 2022

(65) Prior Publication Data

US 2024/0214116 A1 Jun. 27, 2024

(51) Int. Cl.
| | |
|---|---|
| *H04L 1/00* | (2006.01) |
| *H03M 13/25* | (2006.01) |
| *H04B 7/06* | (2006.01) |
| *H04L 1/1812* | (2023.01) |
| *H04W 72/1273* | (2023.01) |

(52) U.S. Cl.
CPC ........ *H04L 1/0063* (2013.01); *H03M 13/255* (2013.01); *H04B 7/0632* (2013.01); *H04L 1/1812* (2013.01); *H04W 72/1273* (2013.01)

(58) Field of Classification Search
CPC .. H04L 1/0063; H04L 1/1812; H03M 13/255; H04B 7/0632; H04W 72/1273
See application file for complete search history.

(56) References Cited

U.S. PATENT DOCUMENTS

| | | | |
|---|---|---|---|
| 9,722,633 B2 | 8/2017 | Koike-Akino | |
| 2005/0246606 A1* | 11/2005 | Cameron | H03M 13/1111 714/752 |
| 2009/0125780 A1* | 5/2009 | Taylor | H04L 5/0064 714/752 |
| 2011/0182345 A1* | 7/2011 | Lei | H04L 1/0071 375/227 |
| 2019/0037437 A1* | 1/2019 | Sun | H04W 28/04 |
| 2023/0072467 A1* | 3/2023 | Thiers | G11C 29/028 |
| 2024/0056133 A1 | 2/2024 | Yang et al. | |
| 2024/0097819 A1* | 3/2024 | Bar-Or Tillinger | H03M 13/353 |

FOREIGN PATENT DOCUMENTS

EP  3609101 A1  2/2020

OTHER PUBLICATIONS

International Search Report and Written Opinion—PCT/US2023/081383—ISA/EPO—Mar. 13, 2024.

* cited by examiner

*Primary Examiner* — Guy J Lamarre
(74) *Attorney, Agent, or Firm* — Harrity & Harrity, LLP \ Qualcomm

(57) ABSTRACT

Various aspects of the present disclosure generally relate to wireless communication. In some aspects, a user equipment (UE) may receive a reference signal for estimation of at least one parameter associated with generation of an adapted low density parity check (LDPC) graph. The UE may transmit an indication of an adapted LDPC graph that is based on at least one adaptation metric associated with the at least one parameter. The UE may receive, based on the adapted LDPC graph, a downlink shared channel communication. Numerous other aspects are described.

30 Claims, 14 Drawing Sheets

LOW DENSITY PARITY CHECK GRAPH ADAPTATION

FIELD OF THE DISCLOSURE

Aspects of the present disclosure generally relate to wireless communication and to techniques and apparatuses for low density parity check graph adaptation.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include one or more network nodes that support communication for wireless communication devices, such as a user equipment (UE) or multiple UEs. A UE may communicate with a network node via downlink communications and uplink communications. "Downlink" (or "DL") refers to a communication link from the network node to the UE, and "uplink" (or "UL") refers to a communication link from the UE to the network node. Some wireless networks may support device-to-device communication, such as via a local link (e.g., a sidelink (SL), a wireless local area network (WLAN) link, and/or a wireless personal area network (WPAN) link, among other examples).

The above multiple access technologies have been adopted in various telecommunication standards to provide a common protocol that enables different UEs to communicate on a municipal, national, regional, and/or global level. New Radio (NR), which may be referred to as 5G, is a set of enhancements to the LTE mobile standard promulgated by the 3GPP. NR is designed to better support mobile broadband internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink, using CP-OFDM and/or single-carrier frequency division multiplexing (SC-FDM) (also known as discrete Fourier transform spread OFDM (DFT-s-OFDM)) on the uplink, as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

Some aspects described herein relate to a user equipment (UE) for wireless communication. The user equipment may include a memory and one or more processors coupled to the memory. The one or more processors may be configured to receive a reference signal for estimation of at least one parameter associated with generation of an adapted low density parity check (LDPC) graph. The one or more processors may be configured to transmit an indication of an adapted LDPC graph that is based on at least one adaptation metric associated with the at least one parameter. The one or more processors may be configured to receive, based on the adapted LDPC graph, a downlink shared channel communication.

Some aspects described herein relate to a network node for wireless communication. The network node may include a memory and one or more processors coupled to the memory. The one or more processors may be configured to transmit a reference signal for estimation of at least one parameter associated with generation of an adapted LDPC graph. The one or more processors may be configured to receive an indication of an adapted LDPC graph that is based on at least one adaptation metric associated with the at least one parameter. The one or more processors may be configured to transmit, based on the adapted LDPC graph, a downlink shared channel communication.

Some aspects described herein relate to a UE for wireless communication. The user equipment may include a memory and one or more processors coupled to the memory. The one or more processors may be configured to transmit an indication of at least one parameter associated with generation of an adapted LDPC graph. The one or more processors may be configured to receive an indication of an adapted LDPC graph that is based on at least one adaptation metric associated with the at least one parameter. The one or more processors may be configured to receive, based on the adapted LDPC graph, a downlink shared channel communication.

Some aspects described herein relate to a network node for wireless communication. The network node may include a memory and one or more processors coupled to the memory. The one or more processors may be configured to receive an indication of at least one parameter associated with generation of an adapted LDPC graph. The one or more processors may be configured to transmit an indication of an adapted LDPC graph that is based on at least one adaptation metric associated with the at least one parameter. The one or more processors may be configured to transmit, based on the adapted LDPC graph, a downlink shared channel communication.

Some aspects described herein relate to a method of wireless communication performed by a UE. The method may include receiving a reference signal for estimation of at least one parameter associated with generation of an adapted LDPC graph. The method may include transmitting an indication of an adapted LDPC graph that is based on at least one adaptation metric associated with the at least one parameter. The method may include receiving, based on the adapted LDPC graph, a downlink shared channel communication.

Some aspects described herein relate to a method of wireless communication performed by a network node. The method may include transmitting a reference signal for estimation of at least one parameter associated with generation of an adapted LDPC graph. The method may include receiving an indication of an adapted LDPC graph that is based on at least one adaptation metric associated with the at least one parameter. The method may include transmitting, based on the adapted LDPC graph, a downlink shared channel communication.

Some aspects described herein relate to a method of wireless communication performed by a UE. The method may include transmitting an indication of at least one parameter associated with generation of an adapted LDPC graph. The method may include receiving an indication of an adapted LDPC graph that is based on at least one adaptation metric associated with the at least one parameter. The method may include receiving, based on the adapted LDPC graph, a downlink shared channel communication.

Some aspects described herein relate to a method of wireless communication performed by a network node. The method may include receiving an indication of at least one parameter associated with generation of an adapted LDPC graph. The method may include transmitting an indication of an adapted LDPC graph that is based on at least one adaptation metric associated with the at least one parameter. The method may include transmitting, based on the adapted LDPC graph, a downlink shared channel communication.

Some aspects described herein relate to a non-transitory computer-readable medium that stores a set of instructions for wireless communication by a UE. The set of instructions, when executed by one or more processors of the UE, may cause the UE to receive a reference signal for estimation of at least one parameter associated with generation of an adapted LDPC graph. The set of instructions, when executed by one or more processors of the UE, may cause the UE to transmit an indication of an adapted LDPC graph that is based on at least one adaptation metric associated with the at least one parameter. The set of instructions, when executed by one or more processors of the UE, may cause the UE to receive, based on the adapted LDPC graph, a downlink shared channel communication.

Some aspects described herein relate to a non-transitory computer-readable medium that stores a set of instructions for wireless communication by a network node. The set of instructions, when executed by one or more processors of the network node, may cause the network node to transmit a reference signal for estimation of at least one parameter associated with generation of an adapted LDPC graph. The set of instructions, when executed by one or more processors of the network node, may cause the network node to receive an indication of an adapted LDPC graph that is based on at least one adaptation metric associated with the at least one parameter. The set of instructions, when executed by one or more processors of the network node, may cause the network node to transmit, based on the adapted LDPC graph, a downlink shared channel communication.

Some aspects described herein relate to a non-transitory computer-readable medium that stores a set of instructions for wireless communication by an UE. The set of instructions, when executed by one or more processors of the UE, may cause the UE to transmit an indication of at least one parameter associated with generation of an adapted LDPC graph. The set of instructions, when executed by one or more processors of the UE, may cause the UE to receive an indication of an adapted LDPC graph that is based on at least one adaptation metric associated with the at least one parameter. The set of instructions, when executed by one or more processors of the UE, may cause the UE to receive, based on the adapted LDPC graph, a downlink shared channel communication.

Some aspects described herein relate to a non-transitory computer-readable medium that stores a set of instructions for wireless communication by a network node. The set of instructions, when executed by one or more processors of the network node, may cause the network node to receive an indication of at least one parameter associated with generation of an adapted LDPC graph. The set of instructions, when executed by one or more processors of the network node, may cause the network node to transmit an indication of an adapted LDPC graph that is based on at least one adaptation metric associated with the at least one parameter. The set of instructions, when executed by one or more processors of the network node, may cause the network node to transmit, based on the adapted LDPC graph, a downlink shared channel communication.

Some aspects described herein relate to an apparatus for wireless communication. The apparatus may include means for receiving a reference signal for estimation of at least one parameter associated with generation of an adapted LDPC graph. The apparatus may include means for transmitting an indication of an adapted LDPC graph that is based on at least one adaptation metric associated with the at least one parameter. The apparatus may include means for receiving, based on the adapted LDPC graph, a downlink shared channel communication.

Some aspects described herein relate to an apparatus for wireless communication. The apparatus may include means for transmitting a reference signal for estimation of at least one parameter associated with generation of an adapted LDPC graph. The apparatus may include means for receiving an indication of an adapted LDPC graph that is based on at least one adaptation metric associated with the at least one parameter. The apparatus may include means for transmitting, based on the adapted LDPC graph, a downlink shared channel communication.

Some aspects described herein relate to an apparatus for wireless communication. The apparatus may include means for transmitting an indication of at least one parameter associated with generation of an adapted LDPC graph. The apparatus may include means for receiving an indication of an adapted LDPC graph that is based on at least one adaptation metric associated with the at least one parameter. The apparatus may include means for receiving, based on the adapted LDPC graph, a downlink shared channel communication.

Some aspects described herein relate to an apparatus for wireless communication. The apparatus may include means for receiving an indication of at least one parameter associated with generation of an adapted LDPC graph. The apparatus may include means for transmitting an indication of an adapted LDPC graph that is based on at least one adaptation metric associated with the at least one parameter. The apparatus may include means for transmitting, based on the adapted LDPC graph, a downlink shared channel communication.

Aspects generally include a method, apparatus, system, computer program product, non-transitory computer-readable medium, user equipment, base station, network entity, network node, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages, will be better understood from the following description when considered in connection with the accompanying figures. Each of the figures is provided for the purposes of illustration and description, and not as a definition of the limits of the claims.

While aspects are described in the present disclosure by illustration to some examples, those skilled in the art will understand that such aspects may be implemented in many different arrangements and scenarios. Techniques described herein may be implemented using different platform types, devices, systems, shapes, sizes, and/or packaging arrangements. For example, some aspects may be implemented via integrated chip embodiments or other non-module-component based devices (e.g., end-user devices, vehicles, communication devices, computing devices, industrial equipment, retail/purchasing devices, medical devices, and/or artificial intelligence devices). Aspects may be implemented in chip-level components, modular components, non-modular components, non-chip-level components, device-level components, and/or system-level components. Devices incorporating described aspects and features may include additional components and features for implementation and practice of claimed and described aspects. For example, transmission and reception of wireless signals may include one or more components for analog and digital purposes (e.g., hardware components including antennas, radio frequency (RF) chains, power amplifiers, modulators, buffers, processors, interleavers, adders, and/or summers). It is intended that aspects described herein may be practiced in a wide variety of devices, components, systems, distributed arrangements, and/or end-user devices of varying size, shape, and constitution.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Figure 1:
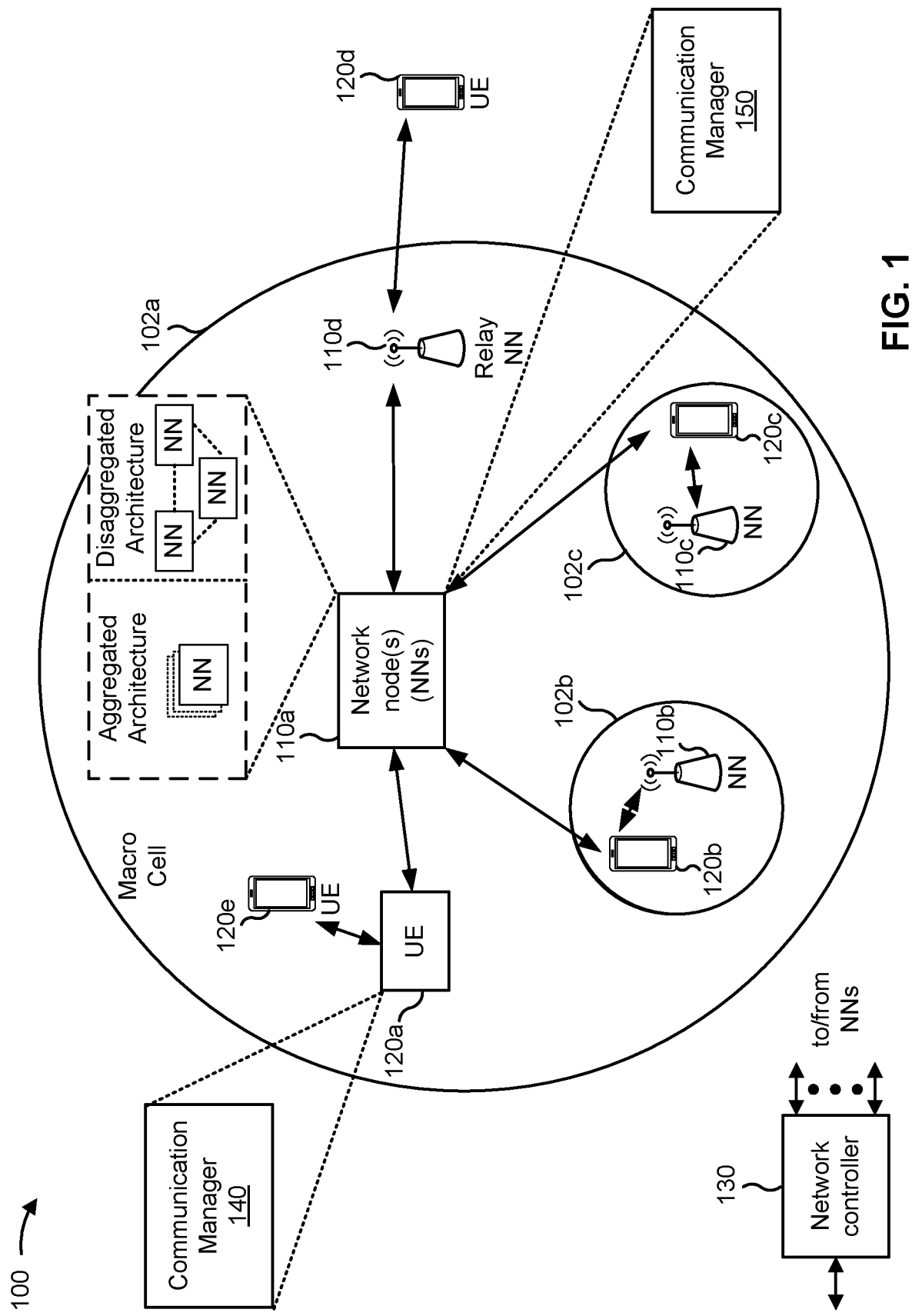
FIG. 1 is a diagram illustrating an example of a wireless network, in accordance with the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. One skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Aspects and examples generally include a method, apparatus, network node, system, computer program product, non-transitory computer-readable medium, user equipment, base station, wireless communication device, and/or processing system as described or substantially described herein with reference to and as illustrated by the drawings and specification.

This disclosure may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages, are better understood from the following description when considered in connection with the accompanying figures. Each of the figures is provided for the purposes of illustration and description, and not as a definition of the limits of the claims.

While aspects are described in the present disclosure by illustration to some examples, such aspects may be implemented in many different arrangements and scenarios. Techniques described herein may be implemented using different platform types, devices, systems, shapes, sizes, and/or packaging arrangements. For example, some aspects may be implemented via integrated chip embodiments or other non-module-component-based devices (e.g., end-user devices, vehicles, communication devices, computing devices, industrial equipment, retail/purchasing devices, medical devices, and/or artificial intelligence devices). Aspects may be implemented in chip-level components, modular components, non-modular components, non-chip-level components, device-level components, and/or system-level components. Devices incorporating described aspects and features may include additional components and features for implementation and practice of claimed and described aspects. For example, transmission and reception of wireless signals may include one or more components for analog and digital purposes (e.g., hardware components including antennas, radio frequency (RF) chains, power amplifiers, modulators, buffers, processors, interleavers, adders, and/or summers). Aspects described herein may be practiced in a wide variety of devices, components, systems, distributed arrangements, and/or end-user devices of varying size, shape, and constitution.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

While aspects may be described herein using terminology commonly associated with a 5G or New Radio (NR) radio access technology (RAT), aspects of the present disclosure can be applied to other RATs, such as a 3G RAT, a 4G RAT, and/or a RAT subsequent to 5G (e.g., 6G).

Various aspects described herein relate to error correction coding processes in wireless communication. Some aspects more specifically relate to using adapted low density parity check (LDPC) graphs for LDPC coding in a communication between two enpoints. In some examples, a user equipment (UE) or a network node may generate an adapted LDPC graph. The adapted LDPC graph may be adapted based on one or more adaptation metrics. An adaptation metric may include any number of measurable characteristics of an application of an adapted LDPC that may be used to generate the adapted LDPC. In some aspects, an adaptation metric may be based on at least one parameter associated with generation of the adapted LDPC graph such as, for example, a communication channel, a power constraint, and/or a performance metric, among other examples. In some aspects, the adaptation metric may be associated with power consumption, a performance associated with a flat channel, a performance associated with a dispersive channel, a convergence of a decoder, and/or performances associated with different coding rates, among other examples. An indication of the adapted LDPC graph may be provided, by the endpoint that generated the adapted LDPC graph, to the other endpoint. The two endpoints may communicate based on the adapted LDPC graph.

Particular aspects of the subject matter described in this disclosure can be implemented to realize one or more of the following potential advantages. In some examples, by facilitating the generation of adapted LDPC graphs, the described techniques can be used to proactively adapt LDPC coding to an evolving scenario, thereby enabling reduction of overall power consumption. Generating and indicating adapted LDPC graphs enables the UE and/or network node to adjust the LDPC coding based on the situation. This enables the UE and/or network node to reduce the complexity and, thus, power consumption associated with the LDPC decoding. Moreover, the reduced power consumption may enable more efficient and effective UE and/or network performance.

FIG. 1 is a diagram illustrating an example of a wireless network 100, in accordance with the present disclosure. The wireless network 100 may be or may include elements of a 5G (e.g., NR) network and/or a 4G (e.g., Long Term Evolution (LTE)) network, among other examples. The wireless network 100 may include one or more network nodes 110 (shown as a network node 110a, a network node 110b, a network node 110c, and a network node 110d), a user equipment (UE) 120 or multiple UEs 120 (shown as a UE 120a, a UE 120b, a UE 120c, a UE 120d, and a UE 120e), and/or other entities. A network node 110 is a network node that communicates with UEs 120. As shown, a network node 110 may include one or more network nodes. For example, a network node 110 may be an aggregated network node, meaning that the aggregated network node is configured to utilize a radio protocol stack that is physically or logically integrated within a single radio access network (RAN) node (e.g., within a single device or unit). As another example, a network node 110 may be a disaggregated network node (sometimes referred to as a disaggregated base station), meaning that the network node 110 is configured to utilize a protocol stack that is physically or logically distributed among two or more nodes (such as one or more central units (CUs), one or more distributed units (DUs), or one or more radio units (RUs)).

In some examples, a network node 110 is or includes a network node that communicates with UEs 120 via a radio access link, such as an RU. In some examples, a network node 110 is or includes a network node that communicates with other network nodes 110 via a fronthaul link or a midhaul link, such as a DU. In some examples, a network node 110 is or includes a network node that communicates with other network nodes 110 via a midhaul link or a core network via a backhaul link, such as a CU. In some examples, a network node 110 (such as an aggregated network node 110 or a disaggregated network node 110) may include multiple network nodes, such as one or more RUs, one or more CUs, and/or one or more DUs. A network node 110 may include, for example, an NR base station, an LTE base station, a Node B, an eNB (e.g., in 4G), a gNB (e.g., in 5G), an access point, a transmission reception point (TRP), a DU, an RU, a CU, a mobility element of a network, a core network node, a network element, a network equipment, a RAN node, or a combination thereof. In some examples, the network nodes 110 may be interconnected to one another or to one or more other network nodes 110 in the wireless network 100 through various types of fronthaul, midhaul, and/or backhaul interfaces, such as a direct physical connection, an air interface, or a virtual network, using any suitable transport network.

In some examples, a network node 110 may provide communication coverage for a particular geographic area. In the Third Generation Partnership Project (3GPP), the term "cell" can refer to a coverage area of a network node 110 and/or a network node subsystem serving this coverage area, depending on the context in which the term is used. A network node 110 may provide communication coverage for a macro cell, a pico cell, a femto cell, and/or another type of cell. A macro cell may cover a relatively large geographic area (e.g., several kilometers in radius) and may allow unrestricted access by UEs 120 with service subscriptions. A pico cell may cover a relatively small geographic area and may allow unrestricted access by UEs 120 with service subscriptions. A femto cell may cover a relatively small geographic area (e.g., a home) and may allow restricted access by UEs 120 having association with the femto cell (e.g., UEs 120 in a closed subscriber group (CSG)). A network node 110 for a macro cell may be referred to as a macro network node. A network node 110 for a pico cell may be referred to as a pico network node. A network node 110 for a femto cell may be referred to as a femto network node or an in-home network node. In the example shown in FIG. 1, the network node 110*a* may be a macro network node for a macro cell 102*a*, the network node 110*b* may be a pico network node for a pico cell 102*b*, and the network node 110*c* may be a femto network node for a femto cell 102*c*. A network node may support one or multiple (e.g., three) cells. In some examples, a cell may not necessarily be stationary, and the geographic area of the cell may move according to the location of a network node 110 that is mobile (e.g., a mobile network node).

In some aspects, the terms "base station" or "network node" may refer to an aggregated base station, a disaggregated base station, an integrated access and backhaul (IAB) node, a relay node, or one or more components thereof. For example, in some aspects, "base station" or "network node" may refer to a CU, a DU, an RU, a Near-Real Time (Near-RT) RAN Intelligent Controller (RIC), or a Non-Real Time (Non-RT) RIC, or a combination thereof. In some aspects, the terms "base station" or "network node" may refer to one device configured to perform one or more functions, such as those described herein in connection with the network node 110. In some aspects, the terms "base station" or "network node" may refer to a plurality of devices configured to perform the one or more functions. For example, in some distributed systems, each of a quantity of different devices (which may be located in the same geographic location or in different geographic locations) may be configured to perform at least a portion of a function, or to duplicate performance of at least a portion of the function, and the terms "base station" or "network node" may refer to any one or more of those different devices. In some aspects, the terms "base station" or "network node" may refer to one or more virtual base stations or one or more virtual base station functions. For example, in some aspects, two or more base station functions may be instantiated on a single device. In some aspects, the terms "base station" or "network node" may refer to one of the base station functions and not another. In this way, a single device may include more than one base station.

The wireless network 100 may include one or more relay stations. A relay station is a network node that can receive a transmission of data from an upstream node (e.g., a network node 110 or a UE 120) and send a transmission of the data to a downstream node (e.g., a UE 120 or a network node 110). A relay station may be a UE 120 that can relay transmissions for other UEs 120. In the example shown in FIG. 1, the network node 110*d* (e.g., a relay network node) may communicate with the network node 110*a* (e.g., a macro network node) and the UE 120*d* in order to facilitate communication between the network node 110*a* and the UE 120*d*. A network node 110 that relays communications may be referred to as a relay station, a relay base station, a relay network node, a relay node, a relay, or the like.

The wireless network 100 may be a heterogeneous network that includes network nodes 110 of different types, such as macro network nodes, pico network nodes, femto network nodes, relay network nodes, or the like. These different types of network nodes 110 may have different transmit power levels, different coverage areas, and/or different impacts on interference in the wireless network 100. For example, macro network nodes may have a high transmit power level (e.g., 5 to 40 watts) whereas pico network nodes, femto network nodes, and relay network nodes may have lower transmit power levels (e.g., 0.1 to 2 watts).

A network controller 130 may couple to or communicate with a set of network nodes 110 and may provide coordination and control for these network nodes 110. The network controller 130 may communicate with the network nodes 110 via a backhaul communication link or a midhaul communication link. The network nodes 110 may communicate with one another directly or indirectly via a wireless or wireline backhaul communication link. In some aspects, the network controller 130 may be a CU or a core network device, or may include a CU or a core network device.

The UEs 120 may be dispersed throughout the wireless network 100, and each UE 120 may be stationary or mobile. A UE 120 may include, for example, an access terminal, a terminal, a mobile station, and/or a subscriber unit. A UE 120 may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device, a biometric device, a wearable device (e.g., a smart watch, smart clothing, smart glasses, a smart wristband, smart jewelry (e.g., a smart ring or a smart bracelet)), an entertainment device (e.g., a music device, a video device, and/or a satellite radio), a vehicular component or sensor, a smart meter/sensor, industrial manufacturing equipment, a global positioning system device, a UE function of a network node, and/or any other suitable device that is configured to communicate via a wireless or wired medium.

Some UEs 120 may be considered machine-type communication (MTC) or evolved or enhanced machine-type communication (eMTC) UEs. An MTC UE and/or an eMTC UE may include, for example, a robot, a drone, a remote device, a sensor, a meter, a monitor, and/or a location tag, that may communicate with a network node, another device (e.g., a remote device), or some other entity. Some UEs 120 may be considered Internet-of-Things (IOT) devices, and/or may be implemented as NB-IOT (narrowband IoT) devices. Some UEs 120 may be considered a Customer Premises Equipment. A UE 120 may be included inside a housing that houses components of the UE 120, such as processor components and/or memory components. In some examples, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks 100 may be deployed in a given geographic area. Each wireless network 100 may support a particular RAT and may operate on one or more frequencies. A RAT may be referred to as a radio technology, an air interface, or the like. A frequency may be referred to as a carrier, a frequency channel, or the like. Each frequency may support a single RAT in a given geographic area in order to avoid interference between wireless networks of different RATs. In some cases, NR or 5G RAT networks may be deployed.

In some examples, two or more UEs 120 (e.g., shown as UE 120*a* and UE 120*e*) may communicate directly using one or more sidelink channels (e.g., without using a network node 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, or a vehicle-to-pedestrian (V2P) protocol), and/or a mesh network. In such examples, a UE 120 may perform scheduling operations, resource selection operations, and/or other operations described elsewhere herein as being performed by the network node 110.

Devices of the wireless network 100 may communicate using the electromagnetic spectrum, which may be subdivided by frequency or wavelength into various classes, bands, channels, or the like. For example, devices of the wireless network 100 may communicate using one or more operating bands. In 5G NR, two initial operating bands have been identified as frequency range designations FR1 (410 MHz-7.125 GHz) and FR2 (24.25 GHz-52.6 GHz). It should be understood that although a portion of FR1 is greater than 6 GHZ, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHZ-24.25 GHZ). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4a or FR4-1 (52.6 GHz-71 GHz), FR4 (52.6 GHz-114.25 GHZ), and FR5 (114.25 GHZ-300 GHz). Each of these higher frequency bands falls within the EHF band.

With the above examples in mind, unless specifically stated otherwise, it should be understood that the term "sub-6 GHz" or the like, if used herein, may broadly represent frequencies that may be less than 6 GHz, may be within FR1, or may include mid-band frequencies. Further, unless specifically stated otherwise, it should be understood that the term "millimeter wave" or the like, if used herein, may broadly represent frequencies that may include mid-band frequencies, may be within FR2, FR4, FR4-a or FR4-1, and/or FR5, or may be within the EHF band. It is contemplated that the frequencies included in these operating bands (e.g., FR1, FR2, FR3, FR4, FR4-a, FR4-1, and/or FR5) may be modified, and techniques described herein are applicable to those modified frequency ranges.

In some aspects, the UE 120 may include a communication manager 140. As described in more detail elsewhere herein, the communication manager 140 may receive a reference signal for estimation of at least one parameter associated with generation of an adapted low density parity check (LDPC) graph; transmit an indication of an adapted LDPC graph that is based on at least one adaptation metric associated with the at least one parameter; and receive, based on the adapted LDPC graph, a downlink shared channel communication. In some aspects, the communication manager 140 may transmit an indication of at least one parameter associated with generation of an adapted LDPC graph; receive an indication of an adapted LDPC graph that is based on at least one adaptation metric associated with the at least one parameter; and receive, based on the adapted LDPC graph, a downlink shared channel communication. Additionally, or alternatively, the communication manager 140 may perform one or more other operations described herein.

In some aspects, the network node 110 may include a communication manager 150. As described in more detail elsewhere herein, the communication manager 150 may transmit a reference signal for estimation of at least one parameter associated with generation of an adapted LDPC graph; receive an indication of an adapted LDPC graph that is based on at least one adaptation metric associated with the at least one parameter; and transmit, based on the adapted LDPC graph, a downlink shared channel communication. In some aspects, the communication manager 150 may receive an indication of at least one parameter associated with generation of an adapted LDPC graph; transmit an indication of an adapted LDPC graph that is based on at least one adaptation metric associated with the at least one parameter; and transmit, based on the adapted LDPC graph, a downlink shared channel communication. Additionally, or alternatively, the communication manager 150 may perform one or more other operations described herein.

As indicated above, FIG. 1 is provided as an example. Other examples may differ from what is described with regard to FIG. 1.

Figure 2:
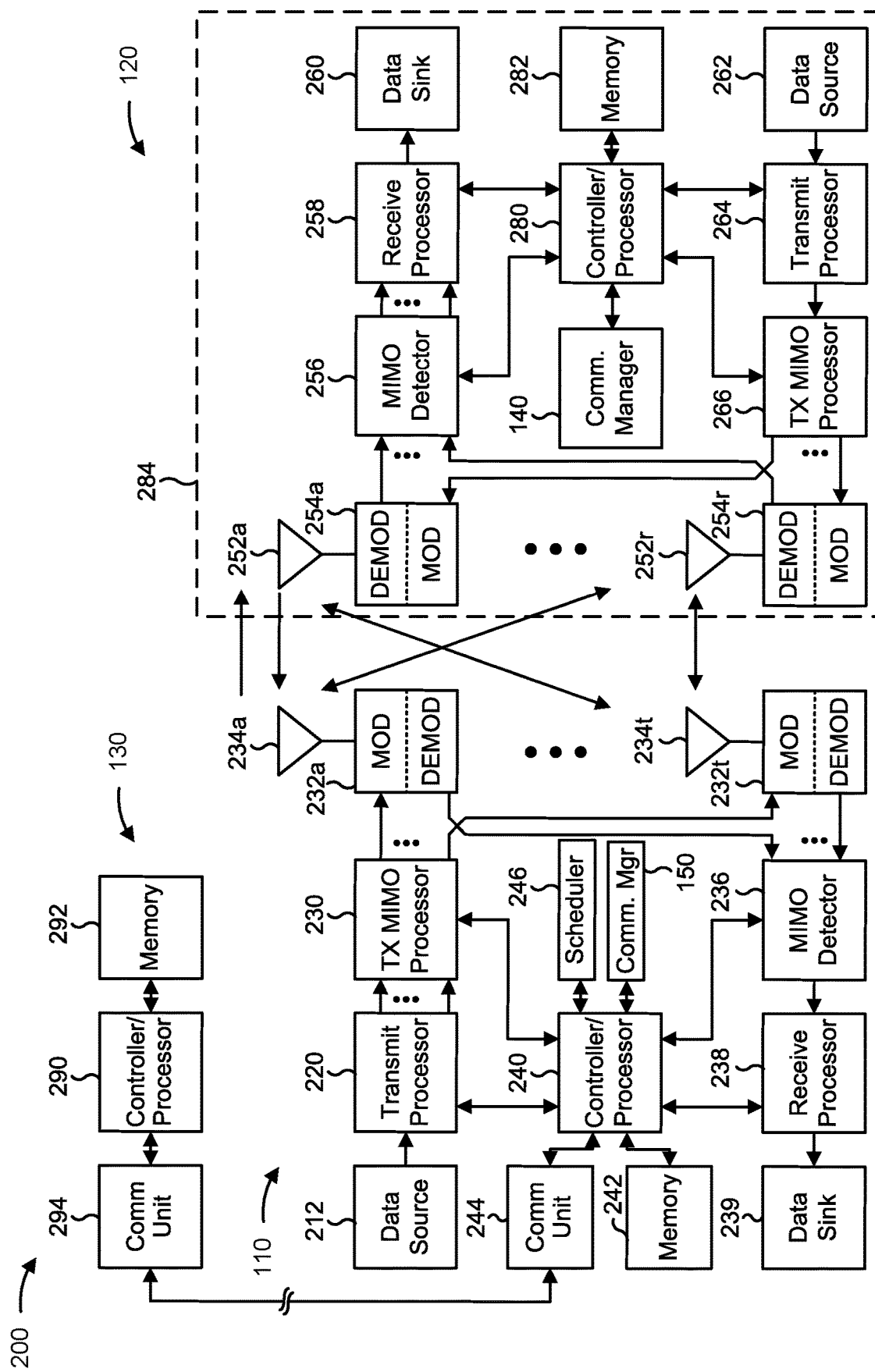
FIG. 2 is a diagram illustrating an example of a network node in communication with a user equipment (UE) in a wireless network, in accordance with the present disclosure.

FIG. 2 is a diagram illustrating an example 200 of a network node 110 in communication with a UE 120 in a wireless network 100, in accordance with the present disclosure. The network node 110 may be equipped with a set of antennas 234a through 234t, such as T antennas (T≥1). The UE 120 may be equipped with a set of antennas 252a through 252r, such as R antennas (R≥1). The network node 110 of example 200 includes one or more radio frequency components, such as antennas 234 and a modem 232. In some examples, a network node 110 may include an interface, a communication component, or another component that facilitates communication with the UE 120 or another network node. Some network nodes 110 may not include radio frequency components that facilitate direct communication with the UE 120, such as one or more CUs, or one or more DUs.

At the network node 110, a transmit processor 220 may receive data, from a data source 212, intended for the UE 120 (or a set of UEs 120). The transmit processor 220 may select one or more modulation and coding schemes (MCSs) for the UE 120 based on one or more channel quality indicators (CQIs) received from that UE 120. The network node 110 may process (e.g., encode and modulate) the data for the UE 120 based on the MCS(s) selected for the UE 120 and may provide data symbols for the UE 120. The transmit processor 220 may process system information (e.g., for semi-static resource partitioning information (SRPI)) and control information (e.g., CQI requests, grants, and/or upper layer signaling) and provide overhead symbols and control symbols. The transmit processor 220 may generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide a set of output symbol streams (e.g., Toutput symbol streams) to a corresponding set of modems 232 (e.g., 7 modems), shown as modems 232a through 232t. For example, each output symbol stream may be provided to a modulator component (shown as MOD) of a modem 232. Each modem 232 may use a respective modulator component to process a respective output symbol stream (e.g., for OFDM) to obtain an output sample stream. Each modem 232 may further use a respective modulator component to process (e.g., convert to analog, amplify, filter, and/or upconvert) the output sample stream to obtain a downlink signal. The modems 232a through 232t may transmit a set of downlink signals (e.g., T downlink signals) via a corresponding set of antennas 234 (e.g., T antennas), shown as antennas 234a through 234t.

At the UE 120, a set of antennas 252 (shown as antennas 252a through 252r) may receive the downlink signals from the network node 110 and/or other network nodes 110 and may provide a set of received signals (e.g., R received signals) to a set of modems 254 (e.g., R modems), shown as modems 254a through 254r. For example, each received signal may be provided to a demodulator component (shown as DEMOD) of a modem 254. Each modem 254 may use a respective demodulator component to condition (e.g., filter, amplify, downconvert, and/or digitize) a received signal to obtain input samples. Each modem 254 may use a demodulator component to further process the input samples (e.g., for OFDM) to obtain received symbols. A MIMO detector 256 may obtain received symbols from the modems 254, may perform MIMO detection on the received symbols if applicable, and may provide detected symbols. A receive processor 258 may process (e.g., demodulate and decode) the detected symbols, may provide decoded data for the UE 120 to a data sink 260, and may provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a CQI parameter, among other examples. In some examples, one or more components of the UE 120 may be included in a housing 284.

The network controller 130 may include a communication unit 294, a controller/processor 290, and a memory 292. The network controller 130 may include, for example, one or more devices in a core network. The network controller 130 may communicate with the network node 110 via the communication unit 294.

One or more antennas (e.g., antennas 234a through 234t and/or antennas 252a through 252r) may include, or may be included within, one or more antenna panels, one or more antenna groups, one or more sets of antenna elements, and/or one or more antenna arrays, among other examples. An antenna panel, an antenna group, a set of antenna elements, and/or an antenna array may include one or more antenna elements (within a single housing or multiple housings), a set of coplanar antenna elements, a set of non-coplanar antenna elements, and/or one or more antenna elements coupled to one or more transmission and/or reception components, such as one or more components of FIG. 2.

On the uplink, at the UE 120, a transmit processor 264 may receive and process data from a data source 262 and control information (e.g., for reports that include RSRP, RSSI, RSRQ, and/or CQI) from the controller/processor 280. The transmit processor 264 may generate reference symbols for one or more reference signals. The symbols from the transmit processor 264 may be precoded by a TX MIMO processor 266 if applicable, further processed by the modems 254 (e.g., for DFT-s-OFDM or CP-OFDM), and transmitted to the network node 110. In some examples, the modem 254 of the UE 120 may include a modulator and a demodulator. In some examples, the UE 120 includes a transceiver. The transceiver may include any combination of the antenna(s) 252, the modem(s) 254, the MIMO detector 256, the receive processor 258, the transmit processor 264, and/or the TX MIMO processor 266. The transceiver may be used by a processor (e.g., the controller/processor 280) and the memory 282 to perform aspects of any of the methods described herein (e.g., with reference to FIGS. 7-14).

At the network node 110, the uplink signals from UE 120 and/or other UEs may be received by the antennas 234, processed by the modem 232 (e.g., a demodulator component, shown as DEMOD, of the modem 232), detected by a MIMO detector 236 if applicable, and further processed by a receive processor 238 to obtain decoded data and control information sent by the UE 120. The receive processor 238 may provide the decoded data to a data sink 239 and provide the decoded control information to the controller/processor 240. The network node 110 may include a communication unit 244 and may communicate with the network controller 130 via the communication unit 244. The network node 110 may include a scheduler 246 to schedule one or more UEs 120 for downlink and/or uplink communications. In some examples, the modem 232 of the network node 110 may include a modulator and a demodulator. In some examples, the network node 110 includes a transceiver. The transceiver may include any combination of the antenna(s) 234, the modem(s) 232, the MIMO detector 236, the receive processor 238, the transmit processor 220, and/or the TX MIMO processor 230. The transceiver may be used by a processor (e.g., the controller/processor 240) and the memory 242 to perform aspects of any of the methods described herein (e.g., with reference to FIGS. 7-14).

In some aspects, the controller/processor 280 may be a component of a processing system. A processing system may generally be a system or a series of machines or components that receives inputs and processes the inputs to produce a set of outputs (which may be passed to other systems or components of, for example, the UE 120). For example, a processing system of the UE 120 may be a system that includes the various other components or sub-components of the UE 120.

The processing system of the UE 120 may interface with one or more other components of the UE 120, may process information received from one or more other components (such as inputs or signals), or may output information to one or more other components. For example, a chip or modem of the UE 120 may include a processing system, a first interface to receive or obtain information, and a second interface to output, transmit, or provide information. In some examples, the first interface may be an interface between the processing system of the chip or modem and a receiver, such that the UE 120 may receive information or signal inputs, and the information may be passed to the processing system. In some examples, the second interface may be an interface between the processing system of the chip or modem and a transmitter, such that the UE 120 may transmit information output from the chip or modem. A person having ordinary skill in the art will readily recognize that the second interface also may obtain or receive information or signal inputs, and the first interface also may output, transmit, or provide information.

In some aspects, the controller/processor 240 may be a component of a processing system. A processing system may generally be a system or a series of machines or components that receives inputs and processes the inputs to produce a set of outputs (which may be passed to other systems or components of, for example, the network node 110). For example, a processing system of the network node 110 may be a system that includes the various other components or subcomponents of the network node 110.

The processing system of the network node 110 may interface with one or more other components of the network node 110, may process information received from one or more other components (such as inputs or signals), or may output information to one or more other components. For example, a chip or modem of the network node 110 may include a processing system, a first interface to receive or obtain information, and a second interface to output, transmit, or provide information. In some examples, the first interface may be an interface between the processing system of the chip or modem and a receiver, such that the network node 110 may receive information or signal inputs, and the information may be passed to the processing system. In some examples, the second interface may be an interface between the processing system of the chip or modem and a transmitter, such that the network node 110 may transmit information output from the chip or modem. A person having ordinary skill in the art will readily recognize that the second interface also may obtain or receive information or signal inputs, and the first interface also may output, transmit, or provide information.

The controller/processor 240 of the network node 110, the controller/processor 280 of the UE 120, and/or any other component(s) of FIG. 2 may perform one or more techniques associated with LDPC graph adaptation, as described in more detail elsewhere herein. For example, the controller/processor 240 of the network node 110, the controller/processor 280 of the UE 120, and/or any other component(s) of FIG. 2 may perform or direct operations of, for example, process 900 of FIG. 9, process 1000 of FIG. 10, process 1100 of FIG. 11, process 1200 of FIG. 12, and/or other processes as described herein. The memory 242 and the memory 282 may store data and program codes for the network node 110 and the UE 120, respectively. In some examples, the memory 242 and/or the memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the network node 110 and/or the UE 120, may cause the one or more processors, the UE 120, and/or the network node 110 to perform or direct operations of, for example, process 900 of FIG. 9, process 1000 of FIG. 10, process 1100 of FIG. 11, process 1200 of FIG. 12, and/or other processes as described herein. In some examples, executing instructions may include running the instructions, converting the instructions, compiling the instructions, and/or interpreting the instructions, among other examples.

In some aspects, a UE (e.g., the UE 120) may include means for receiving a reference signal for estimation of at least one parameter associated with generation of an adapted LDPC graph; means for transmitting an indication of an adapted LDPC graph that is based on at least one adaptation metric associated with the at least one parameter; and/or means for receiving, based on the adapted LDPC graph, a downlink shared channel communication. In some aspects, the UE may include means for transmitting an indication of at least one parameter associated with generation of an adapted LDPC graph; means for receiving an indication of an adapted LDPC graph that is based on at least one adaptation metric associated with the at least one parameter; and/or means for receiving, based on the adapted LDPC graph, a downlink shared channel communication. The means for the UE to perform operations described herein may include, for example, one or more of communication manager 140, antenna 252, modem 254, MIMO detector 256, receive processor 258, transmit processor 264, TX MIMO processor 266, controller/processor 280, or memory 282

In some aspects, a network node (e.g., the network node 110) may include means for transmitting a reference signal for estimation of at least one parameter associated with generation of an adapted LDPC graph; means for receiving an indication of an adapted LDPC graph that is based on at least one adaptation metric associated with the at least one parameter; and/or means for transmitting, based on the adapted LDPC graph, a downlink shared channel communication. In some aspects, the network node may include means for receiving an indication of at least one parameter associated with generation of an adapted LDPC graph; means for transmitting an indication of an adapted LDPC graph that is based on at least one adaptation metric associated with the at least one parameter; and/or means for transmitting, based on the adapted LDPC graph, a downlink shared channel communication. The means for the network node to perform operations described herein may include, for example, one or more of communication manager 150, transmit processor 220, TX MIMO processor 230, modem 232, antenna 234, MIMO detector 236, receive processor 238, controller/processor 240, memory 242, or scheduler 246.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of the controller/processor 280.

As indicated above, FIG. 2 is provided as an example. Other examples may differ from what is described with regard to FIG. 2.

Deployment of communication systems, such as 5G NR systems, may be arranged in multiple manners with various components or constituent parts. In a 5G NR system, or network, a network node, a network entity, a mobility element of a network, a RAN node, a core network node, a network element, a base station, or a network equipment may be implemented in an aggregated or disaggregated architecture. For example, a base station (such as a Node B (NB), an evolved NB (eNB), an NR base station, a 5G NB, an access point (AP), a TRP, or a cell, among other examples), or one or more units (or one or more components) performing base station functionality, may be implemented as an aggregated base station (also known as a standalone base station or a monolithic base station) or a disaggregated base station. "Network entity" or "network node" may refer to a disaggregated base station, or to one or more units of a disaggregated base station (such as one or more CUs, one or more DUs, one or more RUs, or a combination thereof).

An aggregated base station (e.g., an aggregated network node) may be configured to utilize a radio protocol stack that is physically or logically integrated within a single RAN node (e.g., within a single device or unit). A disaggregated base station (e.g., a disaggregated network node) may be configured to utilize a protocol stack that is physically or logically distributed among two or more units (such as one or more CUs, one or more DUs, or one or more RUs). In some examples, a CU may be implemented within a network node, and one or more DUs may be co-located with the CU, or alternatively, may be geographically or virtually distributed throughout one or multiple other network nodes. The DUs may be implemented to communicate with one or more RUs. Each of the CU, DU, and RU also can be implemented as virtual units, such as a virtual central unit (VCU), a virtual distributed unit (VDU), or a virtual radio unit (VRU), among other examples.

Base station-type operation or network design may consider aggregation characteristics of base station functionality. For example, disaggregated base stations may be utilized in an IAB network, an open radio access network (O-RAN (such as the network configuration sponsored by the O-RAN Alliance)), or a virtualized radio access network (vRAN, also known as a cloud radio access network (C-RAN)) to facilitate scaling of communication systems by separating base station functionality into one or more units that can be individually deployed. A disaggregated base station may include functionality implemented across two or more units at various physical locations, as well as functionality implemented for at least one unit virtually, which can enable flexibility in network design. The various units of the disaggregated base station can be configured for wired or wireless communication with at least one other unit of the disaggregated base station.

Figure 3:
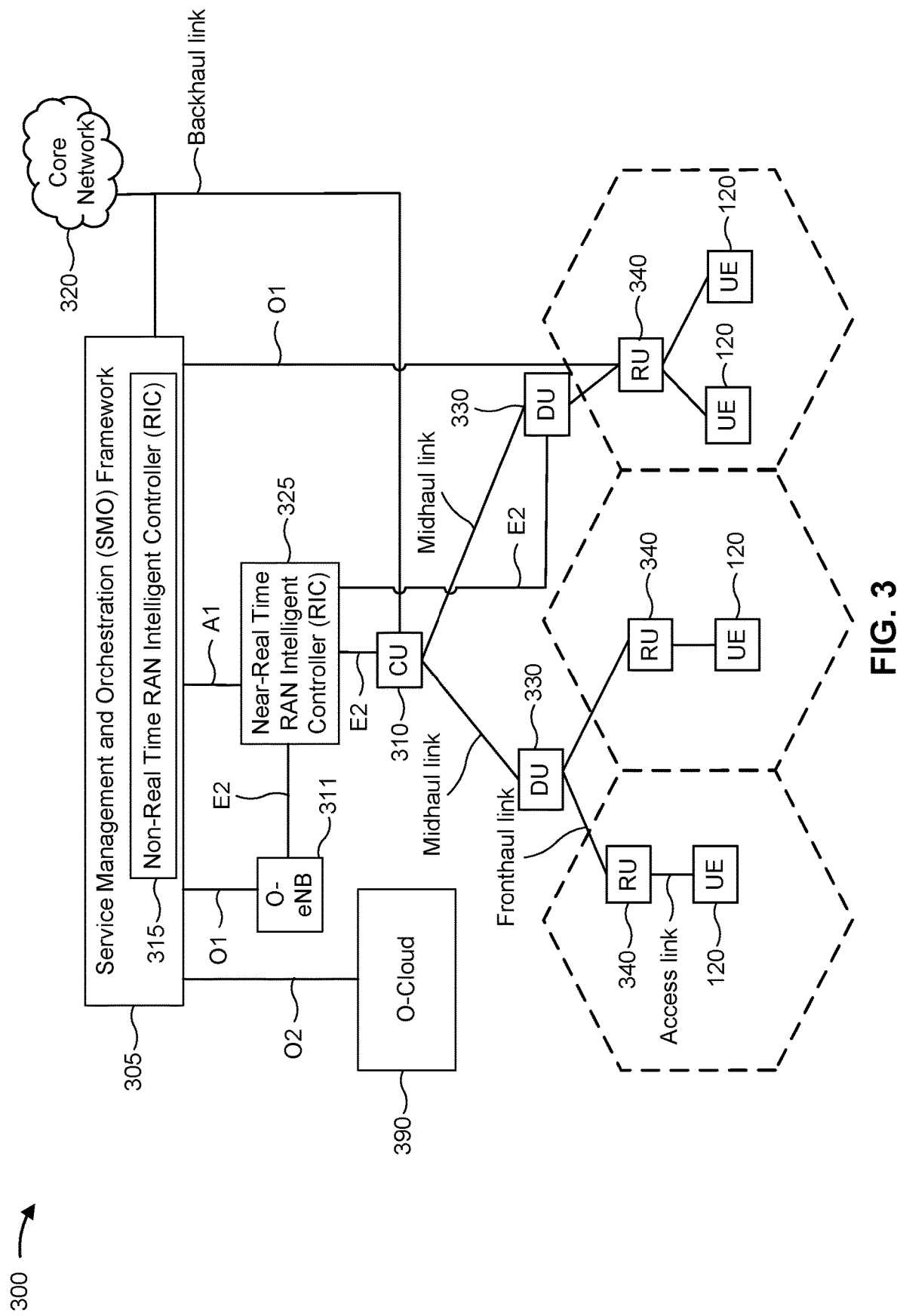
FIG. 3 is a diagram illustrating an example disaggregated base station architecture, in accordance with the present disclosure.

FIG. 3 is a diagram illustrating an example disaggregated base station architecture 300, in accordance with the present disclosure. The disaggregated base station architecture 300 may include a CU 310 that can communicate directly with a core network 320 via a backhaul link, or indirectly with the core network 320 through one or more disaggregated control units (such as a Near-RT RIC 325 via an E2 link, or a Non-RT RIC 315 associated with a Service Management and Orchestration (SMO) Framework 305, or both). A CU 310 may communicate with one or more DUs 330 via respective midhaul links, such as through F1 interfaces. Each of the DUs 330 may communicate with one or more RUs 340 via respective fronthaul links. Each of the RUs 340 may communicate with one or more UEs 120 via respective radio frequency (RF) access links. In some implementations, a UE 120 may be simultaneously served by multiple RUs 340.

Each of the units, including the CUs 310, the DUs 330, the RUs 340, as well as the Near-RT RICs 325, the Non-RT RICs 315, and the SMO Framework 305, may include one or more interfaces or be coupled with one or more interfaces configured to receive or transmit signals, data, or information (collectively, signals) via a wired or wireless transmission medium. Each of the units, or an associated processor or controller providing instructions to one or multiple communication interfaces of the respective unit, can be configured to communicate with one or more of the other units via the transmission medium. In some examples, each of the units can include a wired interface, configured to receive or transmit signals over a wired transmission medium to one or more of the other units, and a wireless interface, which may include a receiver, a transmitter or transceiver (such as an RF transceiver), configured to receive or transmit signals, or both, over a wireless transmission medium to one or more of the other units.

In some aspects, the CU 310 may host one or more higher layer control functions. Such control functions can include radio resource control (RRC) functions, packet data convergence protocol (PDCP) functions, or service data adaptation protocol (SDAP) functions, among other examples. Each control function can be implemented with an interface configured to communicate signals with other control functions hosted by the CU 310. The CU 310 may be configured to handle user plane functionality (for example, Central Unit-User Plane (CU-UP) functionality), control plane functionality (for example, Central Unit-Control Plane (CU-CP) functionality), or a combination thereof. In some implementations, the CU 310 can be logically split into one or more CU-UP units and one or more CU-CP units. A CU-UP unit can communicate bidirectionally with a CU-CP unit via an interface, such as the E1 interface when implemented in an O-RAN configuration. The CU 310 can be implemented to communicate with a DU 330, as necessary, for network control and signaling.

Each DU 330 may correspond to a logical unit that includes one or more base station functions to control the operation of one or more RUs 340. In some aspects, the DU 330 may host one or more of a radio link control (RLC) layer, a medium access control (MAC) layer, and one or more high physical (PHY) layers depending, at least in part, on a functional split, such as a functional split defined by the 3GPP. In some aspects, the one or more high PHY layers may be implemented by one or more modules for forward error correction (FEC) encoding and decoding, scrambling, and modulation and demodulation, among other examples. In some aspects, the DU 330 may further host one or more low PHY layers, such as implemented by one or more modules for a fast Fourier transform (FFT), an inverse FFT (iFFT), digital beamforming, or physical random access channel (PRACH) extraction and filtering, among other examples. Each layer (which also may be referred to as a module) can be implemented with an interface configured to communicate signals with other layers (and modules) hosted by the DU 330, or with the control functions hosted by the CU 310.

Each RU 340 may implement lower-layer functionality. In some deployments, an RU 340, controlled by a DU 330, may correspond to a logical node that hosts RF processing functions or low-PHY layer functions, such as performing an FFT, performing an iFFT, digital beamforming, or PRACH extraction and filtering, among other examples, based on a functional split (for example, a functional split defined by the 3GPP), such as a lower layer functional split. In such an architecture, each RU 340 can be operated to handle over the air (OTA) communication with one or more UEs 120. In some implementations, real-time and non-real-time aspects of control and user plane communication with the RU(s) 340 can be controlled by the corresponding DU 330. In some scenarios, this configuration can enable each DU 330 and the CU 310 to be implemented in a cloud-based RAN architecture, such as a vRAN architecture.

The SMO Framework 305 may be configured to support RAN deployment and provisioning of non-virtualized and virtualized network elements. For non-virtualized network elements, the SMO Framework 305 may be configured to support the deployment of dedicated physical resources for RAN coverage requirements, which may be managed via an operations and maintenance interface (such as an O1 interface). For virtualized network elements, the SMO Framework 305 may be configured to interact with a cloud computing platform (such as an open cloud (O-Cloud) platform 390) to perform network element life cycle management (such as to instantiate virtualized network elements) via a cloud computing platform interface (such as an O2 interface). Such virtualized network elements can include, but are not limited to, CUs 310, DUs 330, RUs 340, non-RT RICs 315, and Near-RT RICs 325. In some implementations, the SMO Framework 305 can communicate with a hardware aspect of a 4G RAN, such as an open eNB (O-eNB) 311, via an O1 interface. Additionally, in some implementations, the SMO Framework 305 can communicate directly with each of one or more RUs 340 via a respective O1 interface. The SMO Framework 305 also may include a Non-RT RIC 315 configured to support functionality of the SMO Framework 305.

The Non-RT RIC 315 may be configured to include a logical function that enables non-real-time control and optimization of RAN elements and resources, Artificial Intelligence/Machine Learning (AI/ML) workflows including model training and updates, or policy-based guidance of applications/features in the Near-RT RIC 325. The Non-RT RIC 315 may be coupled to or communicate with (such as via an A1 interface) the Near-RT RIC 325. The Near-RT RIC 325 may be configured to include a logical function that enables near-real-time control and optimization of RAN elements and resources via data collection and actions over an interface (such as via an E2 interface) connecting one or more CUs 310, one or more DUs 330, or both, as well as an O-eNB, with the Near-RT RIC 325.

In some implementations, to generate AI/ML models to be deployed in the Near-RT RIC 325, the Non-RT RIC 315 may receive parameters or external enrichment information from external servers. Such information may be utilized by the Near-RT RIC 325 and may be received at the SMO Framework 305 or the Non-RT RIC 315 from non-network data sources or from network functions. In some examples, the Non-RT RIC 315 or the Near-RT RIC 325 may be configured to tune RAN behavior or performance. For example, the Non-RT RIC 315 may monitor long-term trends and patterns for performance and employ AI/ML models to perform corrective actions through the SMO Framework 305 (such as reconfiguration via an O1 interface) or via creation of RAN management policies (such as A1 interface policies).

As indicated above, FIG. 3 is provided as an example. Other examples may differ from what is described with regard to FIG. 3.

A communication from a transmitting entity (e.g., a UE 120 or a network node 110) to a receiving entity (e.g., another UE 120 and/or another network node 110) may be encoded based on an error correcting code (sometimes referred to as an error correcting scheme), so that the receiving entity can determine whether the communication was properly decoded (e.g., so that the receiving entity can verify that the communication was not corrupted by noise or the like) and/or so that the receiving entity can correct any transmission errors using bits (e.g., redundant bits) provided by the error correcting code, or the like. One example of an error correcting code is an LDPC code. A communication may be encoded based on an LDPC code to provide for error detection at the receiving entity.

Figure 4:
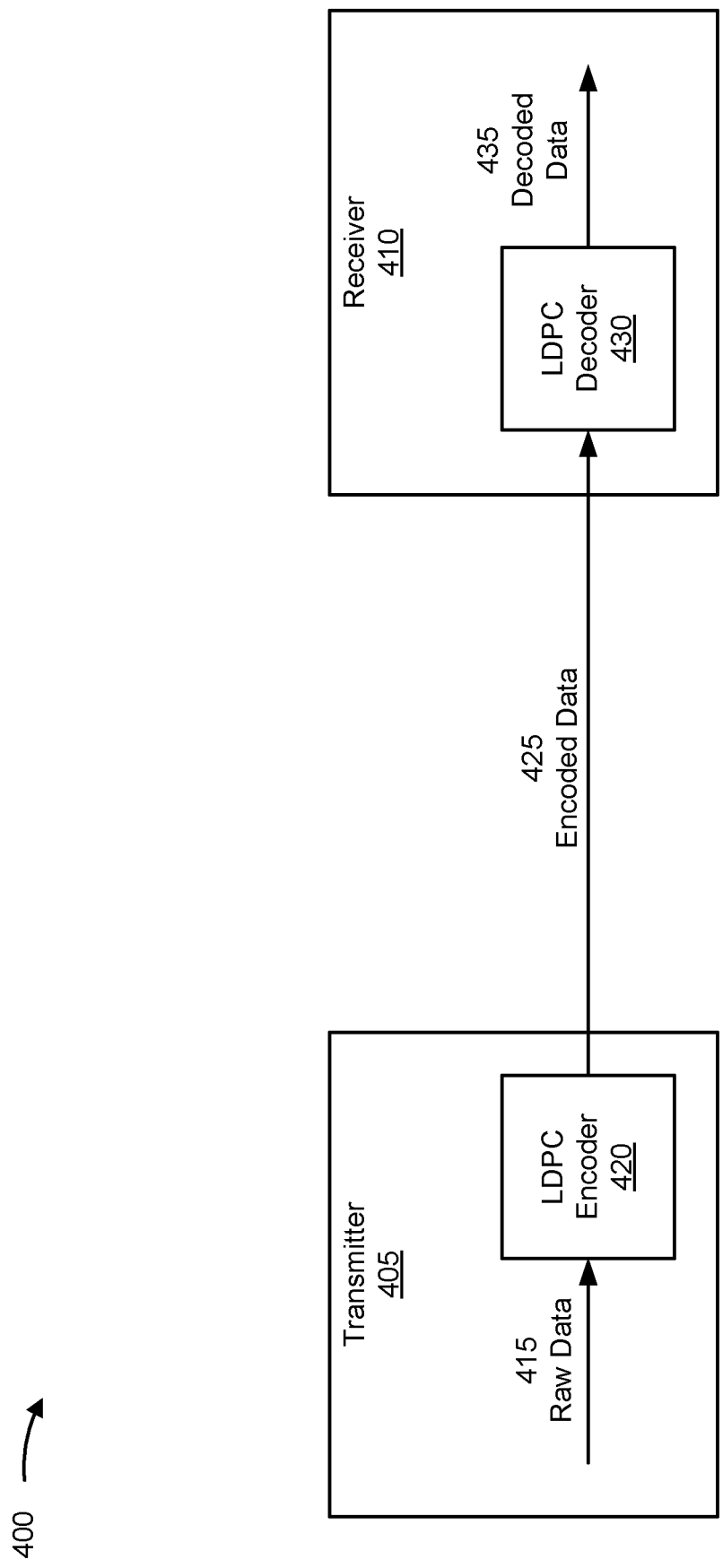
FIG. 4 is a diagram illustrating an example of wireless communication including low density parity check (LDPC) coding, in accordance with the present disclosure.

FIG. 4 is a diagram illustrating an example of wireless communication including LDPC coding, in accordance with the present disclosure. As shown in FIG. 4, a transmitter 405 may be in wireless communication with a receiver 410. In some cases, the transmitter 405 may include one of a UE 120 or a network node 110, and the receiver 410 may include the other one of the UE 120 and the network node 110. The transmitter 405 and the receiver 410 may be in wireless communication via a wireless network, such as the wireless network 100 described in connection with FIG. 1. When the transmitter 405 transmits data to the receiver 410, it may first encode the data using an error correcting code, such as an LDPC code. More particularly, the transmitter 405 may process raw data 415 to be transmitted to the receiver 410 by feeding the raw data 415 through an LDPC encoder 420, among other signal processing components. The transmitter 405 may perform other signal processing operations (e.g., interleaving or the like), which are not shown in FIG. 4 for ease of the description.

The LDPC encoder 420 may add error correction bits to the raw data 415 based on a selected base graph and/or based on a target code rate, forming a stream of encoded data 425. In some aspects, "code rate" may refer to a number of raw data bits divided by a total number of bits in an encoded data stream (e.g., the code rate is the proportion of the data stream that is useful, or non-redundant), and thus LDPC coding or similar processes associated with a lower code rate provide more error protection, but require additional overhead, than LDPC coding or similar processes associated with a higher code rate. The encoded data 425 may be transmitted by the transmitter 405 to the receiver 410 using a RAN or the like, where the encoded data 425 is fed through an LDPC decoder 430 (and, in some aspects, other signal processing components such as a de-interleaver, or the like) in order to extract the decoded data 435 therefrom.

As indicated above, FIG. 4 is provided as an example. Other examples may differ from what is described with regard to FIG. 4.

Encoding for an LDPC may be performed using LDPC codes. LDPC codes may be represented by bipartite graphs, called Tanner graphs, in which one set of nodes, variable nodes, correspond to bits of the codeword and the other set of nodes, constraint nodes, sometimes called check nodes, correspond to the set of parity-check constraints that define the code. Edges in the graph connect variable nodes to constraint nodes. A variable node and a constraint node are said to be neighbors if they are connected by an edge in the graph. In many cases, a pair of nodes is connected by at most one edge. A bit sequence associated one-to-one with the variable nodes is a codeword of the code if, for each constraint node, the bits neighboring the constraint (via their association with variable nodes) sum to Zero modulo two, i.e., they comprise an even number of ones. In some cases, a codeword may be punctured. Puncturing refers to the act of removing or puncturing certain bits from the code word and not actually transmitting them. When encoding an LDPC code, however, bits which are to be punctured are still determined. The decoders and decoding algorithms used to decode LDPC codewords operate by exchanging messages within the graph along the edges and updating these messages by performing computations at the nodes based on the incoming messages. Such algorithms are generally referred to as message passing algorithms. Each variable node in the graph is initially provided with a soft bit, termed a received value, that indicates an estimate of the associated bits value as determined by observations from, e.g., a communication channel. The encoding process also operates in part along the edges of the graph but the connection may be less precise.

The number of edges attached to a node, e.g., a variable node or constraint node, is referred to as the degree of the node. A regular graph or code is one for which all variable nodes have the same degree, and all constraint nodes have the same degree, k. In this case, the code is a (k) regular code. In contrast to a "regular code, an irregular code has constraint nodes and/or variable nodes of differing degrees. For example, some variable nodes may be of degree 4, others of degree 3 and still others of degree 2.

Figure 5:
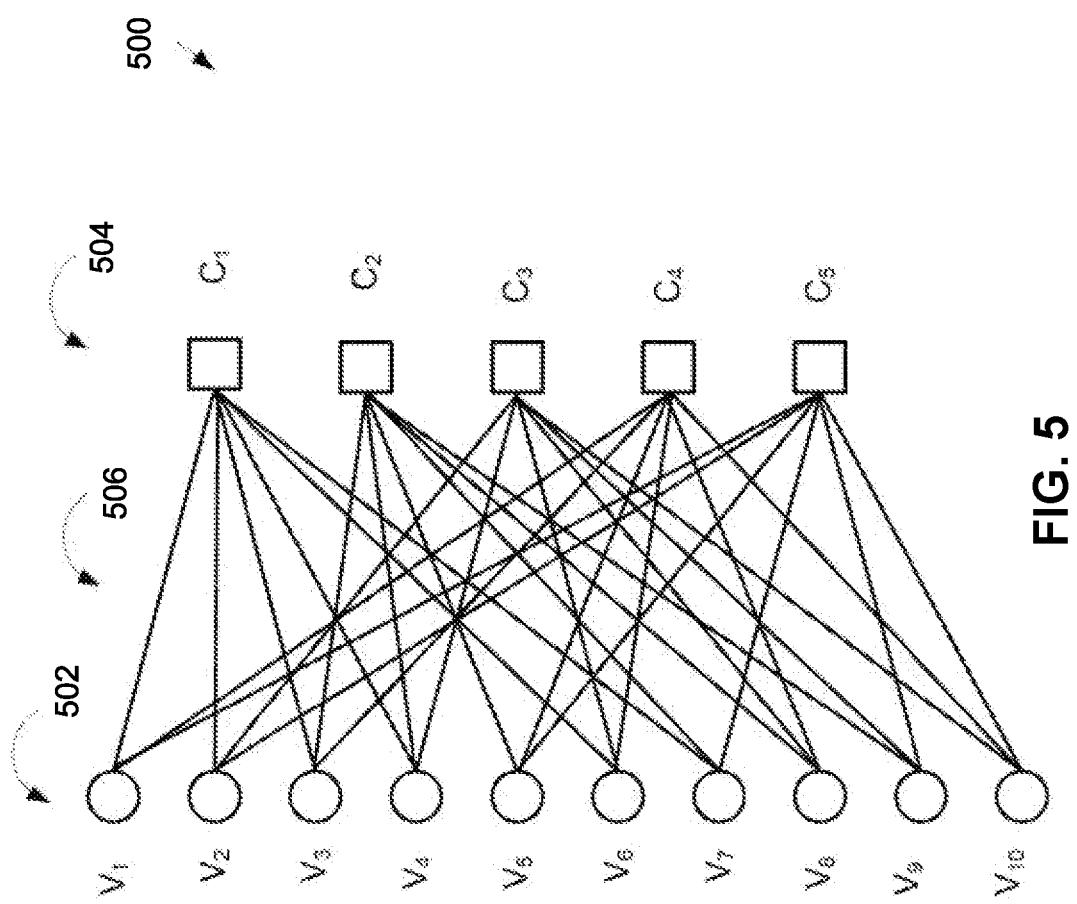
FIG. 5 is a diagram illustrating an example of an LDPC graph, in accordance with the present disclosure.

FIG. 5 is a diagram illustrating an example 500 of an LDPC graph, in accordance with the present disclosure. The LDPC graph of example 500 represents a (3,6) regular LDPC code of length ten and rate one-half. Length ten indicates that there are ten variable nodes $V_1$-$V_{10}$, each identified with one bit of the codeword $X_1$-$X_{10}$. The set of variable nodes $V_1$-$V_{10}$ is generally identified in example 500 by reference number 502. Rate one half indicates that there are half as many check nodes as variable nodes, e.g., there are five check nodes $C_1$-$C_5$ identified by reference number 504, each connected to six variable nodes 502 by respective edges 506. Rate one half further indicates that the five constraints are linearly independent. While example 500 illustrates the graph associated with a code of length 10, it can be appreciated that representing the graph for a codeword of length 1000 would be 100 times more complicated. An alternative to the Tanner graph representation of LDPC codes is the parity check matrix representation.

As indicated above, FIG. 5 is provided as an example. Other examples may differ from what is described with regard to FIG. 5.

Figure 6:
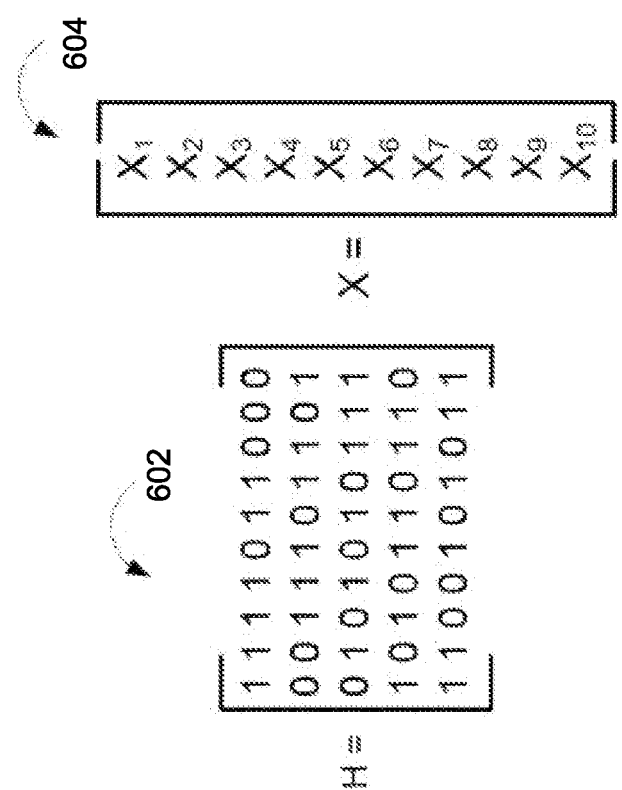
FIG. 6 is a diagram illustrating an example of a parity check matrix representation of an LDPC graph, in accordance with the present disclosure.

FIG. 6 is a diagram illustrating an example 600 of a parity check matrix 602 representation of an LDPC graph, in accordance with the present disclosure. In example 600, the matrix H 602, commonly referred to as the parity check matrix, includes relevant edge connections and variable node and constraint node information associated with the LDPC graph shown in example 500 of FIG. 5. In the matrix 602, each column corresponds to one of the variable nodes while each row corresponds to one of the constraint nodes. Since there are 10 variable nodes and 5 constraint nodes in the exemplary code, the matrix 602 includes 10 columns and 5 rows. The entry of the matrix 602 corresponding to a particular variable node and a particular constraint node is set to 1 if an edge is present in the graph, i.e., if the two nodes are neighbors, otherwise it is set to 0. For example, since variable node $V_1$ is connected to constraint node $C_1$ by an edge, a one is located in the upper most lefthand corner of the matrix 602. However, variable node $V_5$ is not connected to constraint node $C_1$. Thus, a 0 is positioned in the fifth position of the first row of matrix 602 indicating that the corresponding variable and constraint nodes are not connected. The constraints can be considered to be linearly independent if the rows of the matrix 602 are linearly independent vectors over an associated Galois field (GF) such as, for example, GF(2). In the case of a matrix representation, the codeword X which is to be transmitted can be represented as a vector 604 which includes the bits $X_1$-$X_n$, of the codeword to be processed. A bit sequence $X_1$-$X_n$ is a codeword if the product of the matrix 602 and the matrix 604 is equal to zero (e.g., where HX=0).

Although error correction coding processes, such as LDPC coding, may beneficially protect data streams and result in reduced communication error rates, such processes may be associated with large overhead due to the addition of error correction bits to the raw data stream, and/or require relatively high power consumption at the transmitter and the receiver to encode and decode the raw data. For example, in some instances, decoding a channel with an LDPC decoder at the receiver may constitute the greatest power-consuming operation in the digital chain, in some cases representing greater than 60% of the power consumption used by a modem associated with a user equipment (UE). Error correction coding processes, such as LDPC coding, may consume even more power when implemented for high-frequency communications, such as communications in the millimeter wave (e.g., FR2) bands and/or communications in sub-terahertz bands, such as FR4 and beyond. Such high-frequency communications may be associated with relatively large bandwidths and high data/bit rates, leading to high power consumption associated with LDPC decoding processes or the like. For example, for certain sub-terahertz communications, LDPC power consumption may approach 90% of the overall power consumption by the modem associated with the UE. Thus, a network node and a UE may either forgo LDPC coding and similar error correction coding in order to reduce power consumption, leading to increased transmission error rates and thus unreliable communications, or else employ LDPC coding or a similar error correction coding scheme at a cost of high power consumption and large overhead.

Some techniques and apparatuses described herein enable robust error correction coding processes for downlink transmissions, such as downlink transmissions in the sub-terahertz bands, while providing reduced power consumption at a UE as compared to the LDPC decoding processes described above. In some aspects, a UE or a network node may generate an adapted LDPC graph. The adapted LDPC graph may be adapted based on one or more adaptation metrics. An adaptation metric may include any number of measurable characteristics of an application of an adapted LDPC that may be used to generate the adapted LDPC.

In some aspects, an adaptation metric may be based on at least one parameter associated with generation of the adapted LDPC graph. The at least one parameter may be associated with a communication channel, a power constraint, and/or a performance metric, among other examples. For example, in some aspects, the at least one parameter may include a channel response, a channel's power delay profile, a signal to noise ratio (SNR) associated with a channel, and/or a signal to interference plus noise ratio (SINR) associated with a channel, among other examples. In some aspects, the adaptation metric may be associated with power consumption (e.g., based on a quantity of ones in the parity check matrix and/or an efficiency associated with performing a parallel decoding), a performance associated with a flat channel, a performance associated with a dispersive channel, a convergence of a decoder, and/or performances associated with different coding rates (e.g., different coding rates for a graph, different coding rates for retransmissions associated with different redundancy versions, and/or different coding rates associated with puncturing an encoder output), among other examples. For example, the adaptation metric may indicate a power constraint (e.g., associated with a low power mode—a mode of operation that consumes less power than another mode of operation), a code rate, an application of a hybrid automatic repeat request (HARQ) mechanism, and/or a channel condition (e.g., dispersiveness, SNR, SINR), among other examples.

In some aspects, for example, an LDPC decoder may be implemented in an architecture that supports the use of multiple graphs by manipulating the multiplexing of signals according to the positions of ones in the parity check matrix. In some aspects, a UE may receive one or more reference signals and may generate an adapted LDPC graph based on at least one parameter based on the one or more reference signals. The UE may transmit, to a network node, an indication of the adapted LDPC graph. In some aspects, the UE may transmit, to a network node, an indication of at least one parameter associated with one or more reference signals. The network node may generate an adapted LDPC graph based on the indication of the at least one parameter and may transmit an indication of the adapted LDPC graph to the UE. The network node may transmit a downlink shared channel communication based on the adapted LDPC graph. In this way, some aspects described herein may allow for LDPC graph adaptation to facilitate lower power operation modes and to reduce overall power consumption associated with the UE in decoding downlink shared channel communications, thereby positively impacting UE performance.

As indicated above, FIG. 6 is provided as an example. Other examples may differ from what is described with regard to FIG. 6.

Figure 7:
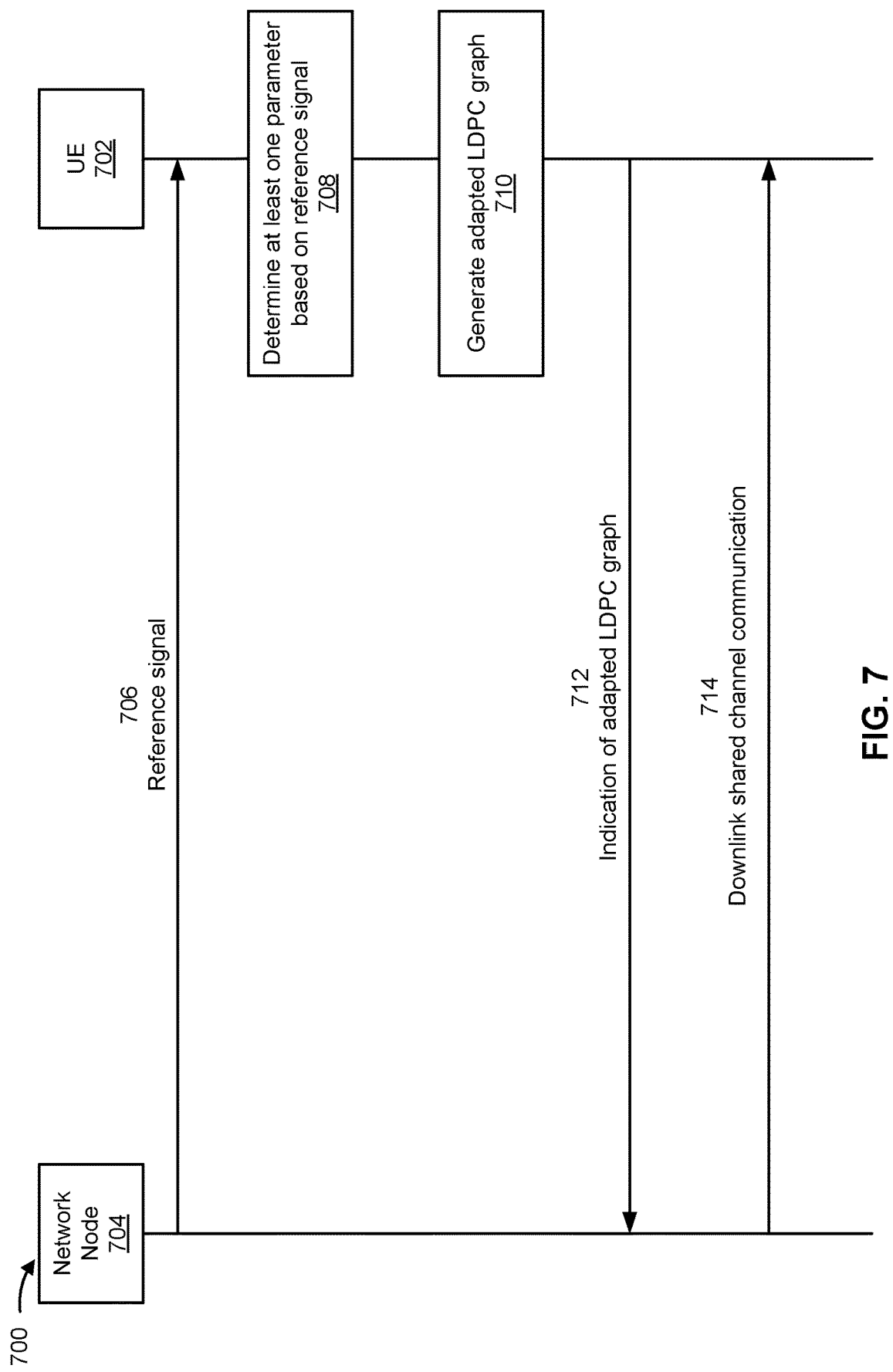
FIG. 7 is a diagram illustrating an example associated with LDPC graph adaptation, in accordance with the present disclosure.

FIG. 7 is a diagram illustrating an example 700 associated with LDPC graph adaptation, in accordance with the present disclosure. Example 700 illustrates aspects in which a UE 702 generates an adapted LDPC graph. As shown, the UE 702 and a network node 704 may communicate with one another. In some aspects, the UE 702 may be, be similar to, include, or be included in, the receiver 410 depicted in FIG. 4 and/or the UE 120 depicted in FIGS. 1-3. In some aspects, the network node 704 may be, be similar to, include, or be included in, the transmitter 405 depicted in FIG. 4, one or more components of the disaggregated base station architecture 300 depicted in FIG. 3, and/or the network node 110 depicted in FIGS. 1 and 2.

As shown by reference number 706, the network node 704 may transmit, and the UE 702 may receive, a reference signal for estimation of at least one parameter associated with generation of an adapted LDPC graph. In some aspects, the reference signal may include at least one of a channel state information-reference signal (CSI-RS) or a demodulation reference signal (DMRS). As shown by reference number 708, the UE 702 may determine at least one parameter based on the reference signal. The at least one parameter may be associated with an LDPC adaptation procedure, as described herein. In some aspects, the at least one parameter may indicate a channel estimation, a power delay profile estimation, an SNR estimation, and/or an SINR estimation. In some aspects, the at least one parameter may include any number of different parameter values, models, and/or sets of measured values, among other examples.

As shown by reference number 710, the UE 702 may generate an adapted LDPC graph. For example, the UE 702 may generate the LDPC graph based on at least one adaptation metric. The at least one adaptation metric may include a power constraint metric, a code rate, a HARQ mechanism use metric (e.g., an indication of whether a HARQ mechanism is to be used), and/or a channel condition metric, among other examples. In some aspects, the UE 702 may generate the adapted LDPC graph based on a machine-learning operation. For example, the UE 702 and/or one or more other devices may implement a machine-learning component to optimize the at least one adaptation metric. In some aspects, the machine-learning component may receive the at least one parameter as input and predict the at least one adaptation metric as output. In some aspects, an error-minimizing procedure may be used to optimize the output based on the input. In some aspects, the optimization procedure may be a static optimization procedure (e.g., a procedure in which all of the inputs are tested statically). In some other aspects, the optimization procedure may be a semi-static optimization procedure (e.g., a procedure in which some inputs are static and others are dynamic), and in still other aspects, the optimization may be a dynamic optimization procedure. In some aspects, for example, the UE 702 may perform the machine-learning operation using at least one neural network to optimize the at least one adaptation metric based on the at least one parameter.

As shown by reference number 712, the UE 702 may transmit, and the network node 704 may receive, an indication of the adapted LDPC graph. In some aspects, the indication may include an LDPC parity check matrix request. For example, the indication may be indicative of a parity check matrix corresponding to the adapted LDPC graph and may (explicitly or implicitly) include a request for the network node to implement the adapted LDPC graph. In some aspects, the indication may be transmitted using a large code block (e.g., a code block having a code block size that satisfies a code block size threshold), in which case, the indication of the adapted LDPC graph may be likely to cause unnecessary overhead. To mitigate that overhead, the UE 702 may perform the optimization procedure based on a quasi-cyclic LDPC (QC-LDPC) configuration.

As shown by reference number 714, the network node 704 may transmit, and the UE 702 may receive a downlink shared channel communication. In some aspects, the downlink shared channel communication may be based on the adapted LDPC graph. In some aspects, receiving the downlink shared channel communication may include decoding, based on the adapted LDPC graph, the downlink shared channel communication.

As indicated above, FIG. 7 is provided as an example. Other examples may differ from what is described with regard to FIG. 7.

Figure 8:
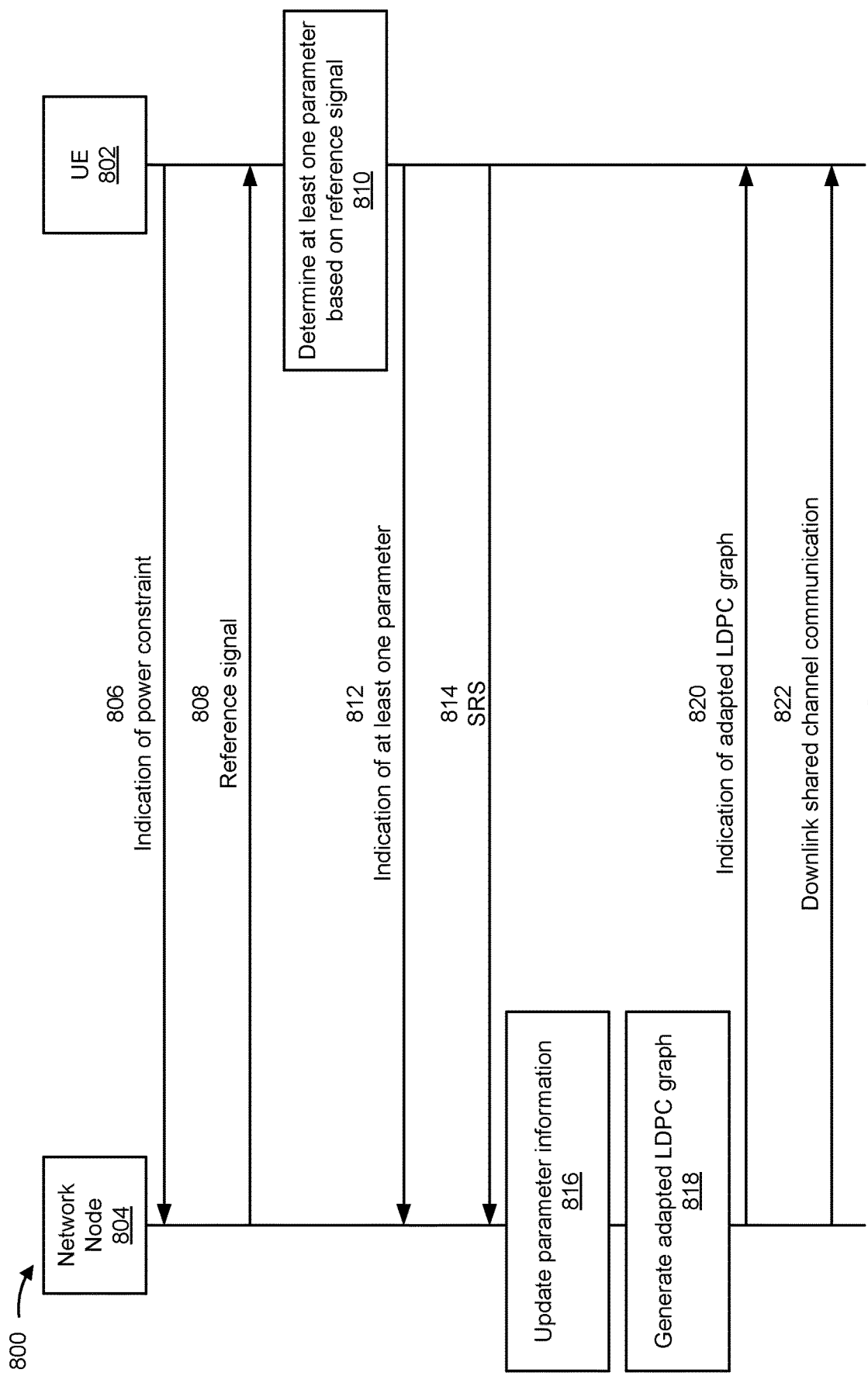
FIG. 8 is a diagram illustrating another example associated with LDPC graph adaptation, in accordance with the present disclosure.

FIG. 8 is a diagram illustrating another example 800 associated with LDPC graph adaptation, in accordance with the present disclosure. As shown, a UE 802 and a network node 804 may communicate with one another. Example 800 illustrates aspects in which the network node 804 generates an adapted LDPC graph. In some aspects, the UE 802 may be, be similar to, include, or be included in, the UE 702 depicted in FIG. 7, the receiver 410 depicted in FIG. 4 and/or the UE 120 depicted in FIGS. 1-3. In some aspects, the network node 804 may be, be similar to, include, or be included in, the network node 704 depicted in FIG. 7, the transmitter 405 depicted in FIG. 4, one or more components of the disaggregated base station architecture 300 depicted in FIG. 3, and/or the network node 110 depicted in FIGS. 1 and 2.

As shown by reference number 806, the UE 802 may transmit, and the network node 804 may receive, an indication of a power constraint associated with the UE 802. In some aspects, at least one adaptation metric used for generating an adapted LDPC graph may be based on the indication of the power constraint. As shown by reference number 808, the network node 804 may transmit, and the UE 802 may receive, a reference signal for estimation of at least one parameter. The at least one parameter may be associated with generating an adapted LDPC graph and may be based on the reference signal. The reference signal may include, for example, a CSI-RS and/or a DMRS, among other examples.

As shown by reference number 810, the UE 802 may determine at least one parameter based on the reference signal. For example, the at least one parameter may indicate at least one of a channel estimation, a power delay profile estimation, an SNR estimation, or an SINR estimation. As shown by reference number 812, the UE 802 may transmit, and the network node 804 may receive, an indication of the at least one parameter. As shown by reference number 814, the UE 802 may transmit, and the network node 804 may receive, a sounding reference signal (SRS). In some aspects, as shown by reference number 816, the network node 804 may use the SRS, in connection with the at least one parameter, to update parameter information maintained at the network node 804. The parameter information may include any number of different types of information received from the UE 802 and/or determined by the network node 804. The parameter information may be associated with a communication channel between the UE 802 and the network node 804, device characteristics of the UE 802 and/or the network node 804, operating states associated with the UE 802 and/or the network node 804, and/or environmental information associated with an environment in which the UE 802 and/or the network node 804 operates, among other examples.

As shown by reference number 818, the network node 804 may generate an adapted LDPC graph based on the at least one adaptation metric. In some aspects, generating the adapted LDPC graph may include generating the adapted LDPC graph based on a machine-learning operation such as, for example, an operation using at least one neural network to optimize the at least one adaptation metric based on the at least one parameter. In some aspects, generating the adapted LDPC graph comprises generating the adapted LDPC graph based on at least one of a static optimization procedure or a semi-static optimization procedure. The at least one adaptation metric may include at least one of a power constraint metric, a code rate, a HARQ mechanism use metric, or a channel condition metric, among other examples.

As shown by reference number 820, the network node 804 may transmit, and the UE 802 may receive, an indication of the adapted LDPC graph. In some aspects, transmitting the indication may include transmitting an indication of an LDPC parity check matrix corresponding to the adapted LDPC graph. In some aspects, the adapted LDPC graph may be based on a QC-LDPC configuration. For example, the adapted LDPC graph may be based on the QC-LDPC configuration based on a code block size of a code block corresponding to the indication satisfying a code block size threshold.

As shown by reference number 822, the network node 804 may transmit, and the UE 802 may receive, based on the adapted LDPC graph, a downlink shared channel communication.

As indicated above, FIG. 8 is provided as an example. Other examples may differ from what is described with regard to FIG. 8.

Figure 9:
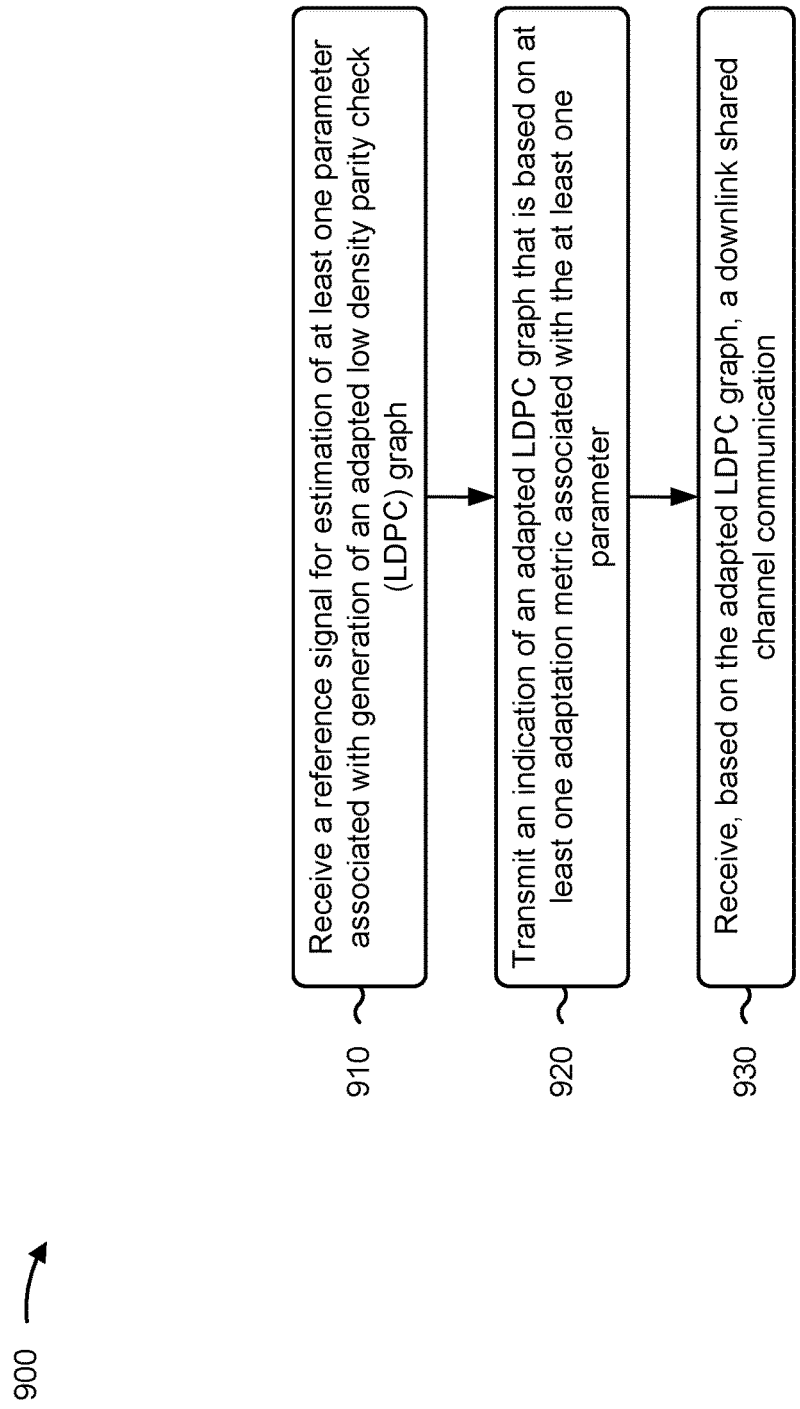
FIG. 9 is a diagram illustrating an example process performed, for example, by a UE, in accordance with the present disclosure.

FIG. 9 is a diagram illustrating an example process 900 performed, for example, by a UE, in accordance with the present disclosure. Example process 900 is an example where the UE (e.g., UE 702) performs operations associated with LDPC graph adaptation.

As shown in FIG. 9, in some aspects, process 900 may include receiving a reference signal for estimation of at least one parameter associated with generation of an adapted LDPC graph (block 910). For example, the UE (e.g., using communication manager 1308 and/or reception component 1302, depicted in FIG. 13) may receive a reference signal for estimation of at least one parameter associated with generation of an adapted LDPC graph, as described above.

As further shown in FIG. 9, in some aspects, process 900 may include transmitting an indication of an adapted LDPC graph that is based on at least one adaptation metric associated with the at least one parameter (block 920). For example, the UE (e.g., using communication manager 1308 and/or transmission component 1304, depicted in FIG. 13) may transmit an indication of an adapted LDPC graph that is based on at least one adaptation metric associated with the at least one parameter, as described above.

As further shown in FIG. 9, in some aspects, process 900 may include receiving, based on the adapted LDPC graph, a downlink shared channel communication (block 930). For example, the UE (e.g., using communication manager 1308 and/or reception component 1302, depicted in FIG. 13) may receive, based on the adapted LDPC graph, a downlink shared channel communication, as described above.

Process 900 may include additional aspects, such as any single aspect or any combination of aspects described below and/or in connection with one or more other processes described elsewhere herein.

In a first aspect, receiving the downlink shared channel communication comprises decoding, based on the adapted LDPC graph, the downlink shared channel communication. In a second aspect, alone or in combination with the first aspect, the reference signal comprises at least one of a CSI-RS or a DMRS. In a third aspect, alone or in combination with one or more of the first and second aspects, the at least one parameter indicates at least one of a channel estimation, a power delay profile estimation, an SNR estimation, or an SINR estimation. In a fourth aspect, alone or in combination with one or more of the first through third aspects, process 900 includes generating the adapted LDPC graph based on the at least one adaptation metric.

In a fifth aspect, alone or in combination with one or more of the first through fourth aspects, generating the adapted LDPC graph comprises generating the adapted LDPC graph based on a machine-learning operation. In a sixth aspect, alone or in combination with one or more of the first through fifth aspects, generating the adapted LDPC graph comprises performing the machine-learning operation using at least one neural network to optimize the at least one adaptation metric based on the at least one parameter. In a seventh aspect, alone or in combination with one or more of the first through sixth aspects, generating the adapted LDPC graph comprises generating the adapted LDPC graph based on at least one of a static optimization procedure or a semi-static optimization procedure. In an eighth aspect, alone or in combination with one or more of the first through seventh aspects, the at least one adaptation metric comprises at least one of a power constraint metric, a code rate, a HARQ mechanism use metric, or a channel condition metric.

In a ninth aspect, alone or in combination with one or more of the first through eighth aspects, the adapted LDPC graph is based on a QC-LDPC configuration. In a tenth aspect, alone or in combination with one or more of the first through ninth aspects, the adapted LDPC graph is based on the QC-LDPC configuration based on a code block size of a code block corresponding to the indication satisfying a code block size threshold. In an eleventh aspect, alone or in combination with one or more of the first through tenth aspects, transmitting the indication comprises transmitting an LDPC parity check matrix request, the method further comprising receiving an indication of application of the LDPC request.

Although FIG. 9 shows example blocks of process 900, in some aspects, process 900 may include additional blocks, fewer blocks, different blocks, or differently arranged blocks than those depicted in FIG. 9. Additionally, or alternatively, two or more of the blocks of process 900 may be performed in parallel.

Figure 10:
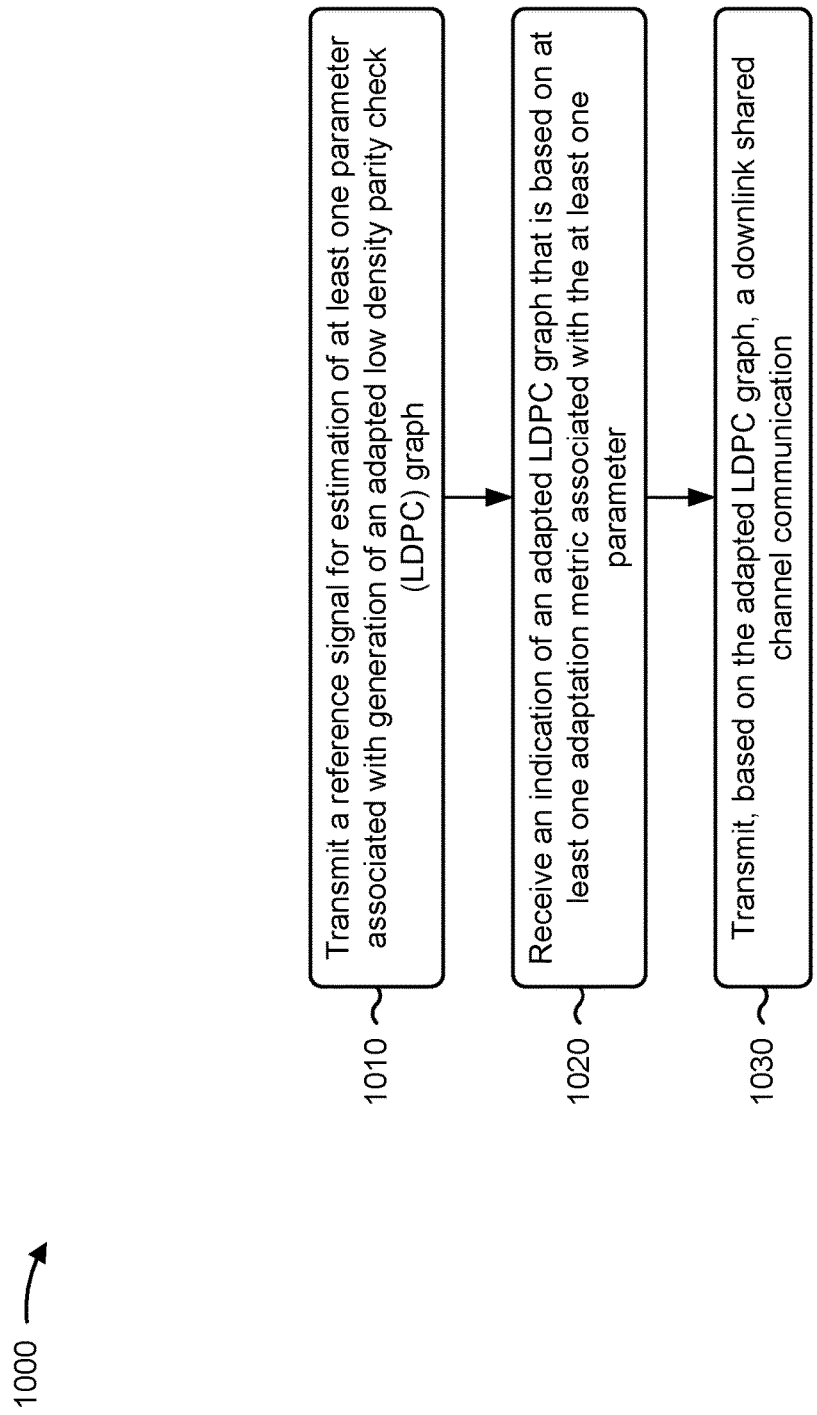
FIG. 10 is a diagram illustrating an example process performed, for example, by a network node, in accordance with the present disclosure.

FIG. 10 is a diagram illustrating an example process 1000 performed, for example, by a network node, in accordance with the present disclosure. Example process 1000 is an example where the network node (e.g., network node 704) performs operations associated with LDPC graph adaptation.

As shown in FIG. 10, in some aspects, process 1000 may include transmitting a reference signal for estimation of at least one parameter associated with generation of an adapted LDPC graph (block 1010). For example, the network node (e.g., using communication manager 1408 and/or transmission component 1404, depicted in FIG. 14) may transmit a reference signal for estimation of at least one parameter associated with generation of an adapted LDPC graph, as described above.

As further shown in FIG. 10, in some aspects, process 1000 may include receiving an indication of an adapted LDPC graph that is based on at least one adaptation metric associated with the at least one parameter (block 1020). For example, the network node (e.g., using communication manager 1408 and/or reception component 1402, depicted in FIG. 14) may receive an indication of an adapted LDPC graph that is based on at least one adaptation metric associated with the at least one parameter, as described above.

As further shown in FIG. 10, in some aspects, process 1000 may include transmitting, based on the adapted LDPC graph, a downlink shared channel communication (block 1030). For example, the network node (e.g., using communication manager 1408 and/or transmission component 1404, depicted in FIG. 14) may transmit, based on the adapted LDPC graph, a downlink shared channel communication, as described above.

Process 1000 may include additional aspects, such as any single aspect or any combination of aspects described below and/or in connection with one or more other processes described elsewhere herein.

In a first aspect, the reference signal comprises at least one of a CSI-RS or a DMRS. In a second aspect, alone or in combination with the first aspect, the at least one parameter indicates at least one of a channel estimation, a power delay profile estimation, an SNR estimation, or an SINR estimation. In a third aspect, alone or in combination with one or more of the first and second aspects, the adapted LDPC graph is based on a machine-learning operation. In a fourth aspect, alone or in combination with one or more of the first through third aspects, the machine-learning operation comprises an optimization procedure associated with at least one neural network configured to optimize the at least one adaptation metric based on the at least one parameter. In a fifth aspect, alone or in combination with one or more of the first through fourth aspects, the adapted LDPC graph is based on at least one of a static optimization procedure or a semi-static optimization procedure. In a sixth aspect, alone or in combination with one or more of the first through fifth aspects, the at least one adaptation metric comprises at least one of a power constraint metric, a code rate, a HARQ mechanism use metric, or a channel condition metric.

In a seventh aspect, alone or in combination with one or more of the first through sixth aspects, the adapted LDPC graph is based on a QC-LDPC configuration. In an eighth aspect, alone or in combination with one or more of the first through seventh aspects, the adapted LDPC graph is based on the QC-LDPC configuration based on a code block size of a code block corresponding to the indication satisfying a code block size threshold. In a ninth aspect, alone or in combination with one or more of the first through eighth aspects, receiving the indication comprises receiving an LDPC parity check matrix request, the method further comprising transmitting an indication of application of the LDPC request.

Although FIG. 10 shows example blocks of process 1000, in some aspects, process 1000 may include additional blocks, fewer blocks, different blocks, or differently arranged blocks than those depicted in FIG. 10. Additionally, or alternatively, two or more of the blocks of process 1000 may be performed in parallel.

Figure 11:
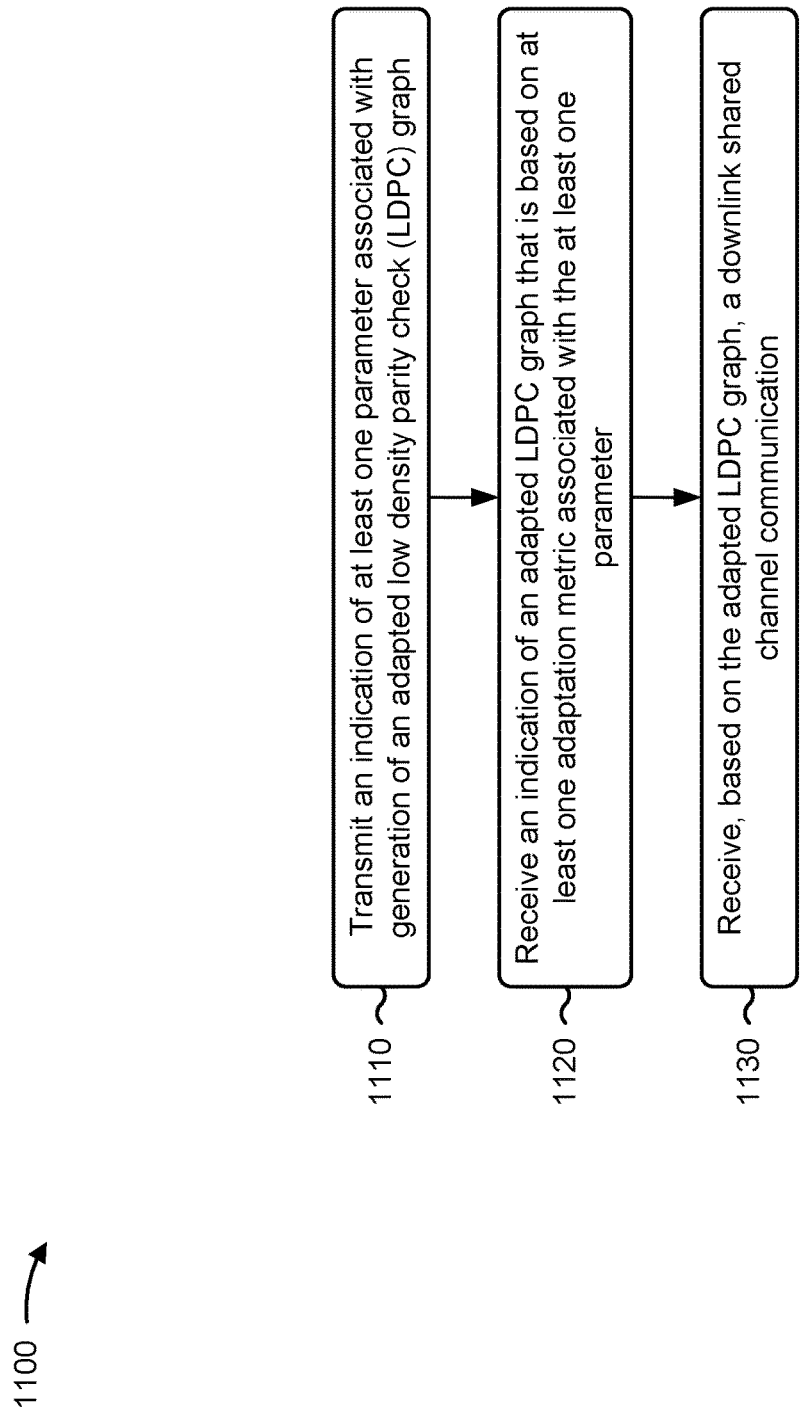
FIG. 11 is a diagram illustrating an example process performed, for example, by a UE, in accordance with the present disclosure.

FIG. 11 is a diagram illustrating an example process 1100 performed, for example, by a UE, in accordance with the present disclosure. Example process 1100 is an example where the UE (e.g., UE 802) performs operations associated with LDPC graph adaptation.

As shown in FIG. 11, in some aspects, process 1100 may include transmitting an indication of at least one parameter associated with generation of an adapted LDPC graph (block 1110). For example, the UE (e.g., using communication manager 1308 and/or transmission component 1304, depicted in FIG. 13) may transmit an indication of at least one parameter associated with generation of an adapted LDPC graph, as described above.

As further shown in FIG. 11, in some aspects, process 1100 may include receiving an indication of an adapted LDPC graph that is based on at least one adaptation metric associated with the at least one parameter (block 1120). For example, the UE (e.g., using communication manager 1308 and/or reception component 1302, depicted in FIG. 13) may receive an indication of an adapted LDPC graph that is based on at least one adaptation metric associated with the at least one parameter, as described above.

As further shown in FIG. 11, in some aspects, process 1100 may include receiving, based on the adapted LDPC graph, a downlink shared channel communication (block 1130). For example, the UE (e.g., using communication manager 1308 and/or reception component 1302, depicted in FIG. 13) may receive, based on the adapted LDPC graph, a downlink shared channel communication, as described above.

Process 1100 may include additional aspects, such as any single aspect or any combination of aspects described below and/or in connection with one or more other processes described elsewhere herein.

In a first aspect, receiving the downlink shared channel communication comprises decoding, based on the adapted LDPC graph, the downlink shared channel communication. In a second aspect, alone or in combination with the first aspect, process 1100 includes receiving a reference signal for estimation of the at least one parameter, wherein the at least one parameter is based on the reference signal. In a third aspect, alone or in combination with one or more of the first and second aspects, the reference signal comprises at least one of a CSI-RS or a DMRS. In a fourth aspect, alone or in combination with one or more of the first through third aspects, the at least one parameter indicates at least one of a channel estimation, a power delay profile estimation, an SNR estimation, or an SINR estimation.

In a fifth aspect, alone or in combination with one or more of the first through fourth aspects, the adapted LDPC graph is based on a machine-learning operation. In a sixth aspect, alone or in combination with one or more of the first through fifth aspects, the machine-learning operation comprises an optimization procedure associated with at least one neural network configured to optimize the at least one adaptation metric based on the at least one parameter. In a seventh aspect, alone or in combination with one or more of the first through sixth aspects, the adapted LDPC graph is based on at least one of a static optimization procedure or a semi-static optimization procedure. In an eighth aspect, alone or in combination with one or more of the first through seventh aspects, the at least one adaptation metric comprises at least one of a power constraint metric, a code rate, a HARQ mechanism use metric, or a channel condition metric.

In a ninth aspect, alone or in combination with one or more of the first through eighth aspects, the adapted LDPC graph is based on a QC-LDPC configuration. In a tenth aspect, alone or in combination with one or more of the first through ninth aspects, the adapted LDPC graph is based on the QC-LDPC configuration based on a code block size of a code block corresponding to the indication satisfying a code block size threshold. In an eleventh aspect, alone or in combination with one or more of the first through tenth aspects, receiving the indication comprises receiving an indication of an LDPC parity check matrix. In a twelfth aspect, alone or in combination with one or more of the first through eleventh aspects, process 1100 includes transmitting an SRS, wherein the at least one adaptation metric is based on the SRS. In a thirteenth aspect, alone or in combination with one or more of the first through twelfth aspects, process 1100 includes transmitting an indication of a power constraint associated with the UE, wherein the at least one adaptation metric is based on the indication of the power constraint.

Although FIG. 11 shows example blocks of process 1100, in some aspects, process 1100 may include additional blocks, fewer blocks, different blocks, or differently arranged blocks than those depicted in FIG. 11. Additionally, or alternatively, two or more of the blocks of process 1100 may be performed in parallel.

Figure 12:
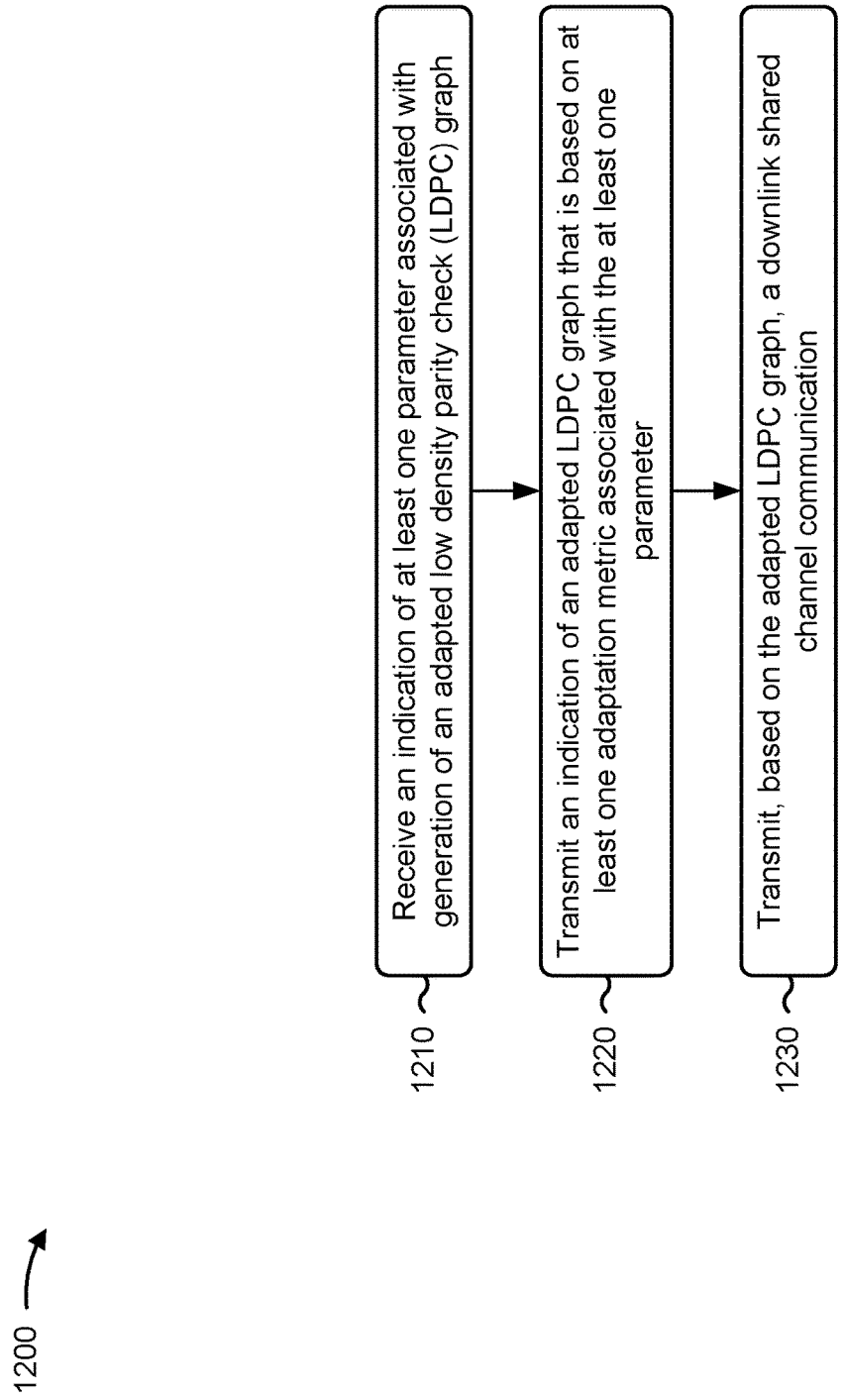
FIG. 12 is a diagram illustrating an example process performed, for example, by a network node, in accordance with the present disclosure.

FIG. 12 is a diagram illustrating an example process 1200 performed, for example, by a network node, in accordance with the present disclosure. Example process 1200 is an example where the network node (e.g., network node 804) performs operations associated with LDPC graph adaptation.

As shown in FIG. 12, in some aspects, process 1200 may include receiving an indication of at least one parameter associated with generation of an adapted LDPC graph (block 1210). For example, the network node (e.g., using communication manager 1408 and/or reception component 1402, depicted in FIG. 14) may receive an indication of at least one parameter associated with generation of an adapted LDPC graph, as described above.

As further shown in FIG. 12, in some aspects, process 1200 may include transmitting an indication of an adapted LDPC graph that is based on at least one adaptation metric associated with the at least one parameter (block 1220). For example, the network node (e.g., using communication manager 1408 and/or transmission component 1404, depicted in FIG. 14) may transmit an indication of an adapted LDPC graph that is based on at least one adaptation metric associated with the at least one parameter, as described above.

As further shown in FIG. 12, in some aspects, process 1200 may include transmitting, based on the adapted LDPC graph, a downlink shared channel communication (block 1230). For example, the network node (e.g., using communication manager 1408 and/or transmission component 1404, depicted in FIG. 14) may transmit, based on the adapted LDPC graph, a downlink shared channel communication, as described above.

Process 1200 may include additional aspects, such as any single aspect or any combination of aspects described below and/or in connection with one or more other processes described elsewhere herein.

In a first aspect, process 1200 includes transmitting a reference signal for estimation of the at least one parameter, wherein the at least one parameter is based on the reference signal. In a second aspect, alone or in combination with the first aspect, the reference signal comprises at least one of a CSI-RS or a DMRS. In a third aspect, alone or in combination with one or more of the first and second aspects, the at least one parameter indicates at least one of a channel estimation, a power delay profile estimation, an SNR estimation, or an SINR estimation. In a fourth aspect, alone or in combination with one or more of the first through third aspects, process 1200 includes generating the adapted LDPC graph based on the at least one adaptation metric.

In a fifth aspect, alone or in combination with one or more of the first through fourth aspects, generating the adapted LDPC graph comprises generating the adapted LDPC graph based on a machine-learning operation. In a sixth aspect, alone or in combination with one or more of the first through fifth aspects, generating the adapted LDPC graph comprises performing the machine-learning operation using at least one neural network to optimize the at least one adaptation metric based on the at least one parameter. In a seventh aspect, alone or in combination with one or more of the first through sixth aspects, generating the adapted LDPC graph comprises generating the adapted LDPC graph based on at least one of a static optimization procedure or a semi-static optimization procedure. In an eighth aspect, alone or in combination with one or more of the first through seventh aspects, the at least one adaptation metric comprises at least one of a power constraint metric, a code rate, a HARQ mechanism use metric, or a channel condition metric.

In a ninth aspect, alone or in combination with one or more of the first through eighth aspects, the adapted LDPC graph is based on a QC-LDPC configuration. In a tenth aspect, alone or in combination with one or more of the first through ninth aspects, the adapted LDPC graph is based on the QC-LDPC configuration based on a code block size of a code block corresponding to the indication satisfying a code block size threshold. In an eleventh aspect, alone or in combination with one or more of the first through tenth aspects, transmitting the indication comprises transmitting an indication of an LDPC parity check matrix. In a twelfth aspect, alone or in combination with one or more of the first through eleventh aspects, process 1200 includes receiving an SRS, wherein the at least one adaptation metric is based on the SRS. In a thirteenth aspect, alone or in combination with one or more of the first through twelfth aspects, process 1200 includes receiving an indication of a power constraint associated with a UE, wherein the at least one adaptation metric is based on the indication of the power constraint.

Although FIG. 12 shows example blocks of process 1200, in some aspects, process 1200 may include additional blocks, fewer blocks, different blocks, or differently arranged blocks than those depicted in FIG. 12. Additionally, or alternatively, two or more of the blocks of process 1200 may be performed in parallel.

Figure 13:
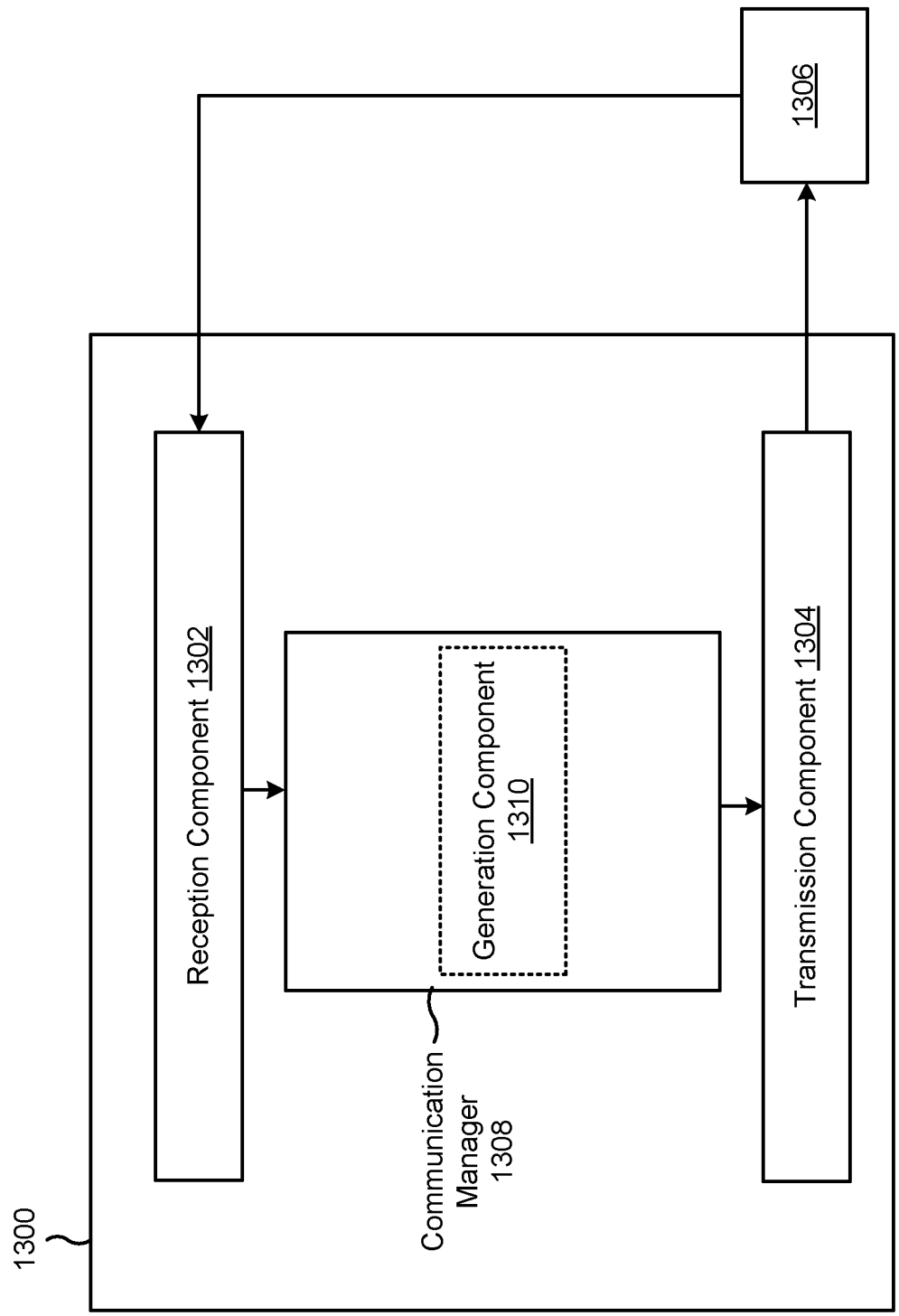
FIG. 13 is a diagram of an example apparatus for wireless communication, in accordance with the present disclosure.

FIG. 13 is a diagram of an example apparatus 1300 for wireless communication, in accordance with the present disclosure. The apparatus 1300 may be a UE, or a UE may include the apparatus 1300. In some aspects, the apparatus 1300 includes a reception component 1302 and a transmission component 1304, which may be in communication with one another (for example, via one or more buses and/or one or more other components). As shown, the apparatus 1300 may communicate with another apparatus 1306 (such as a UE, a base station, or another wireless communication device) using the reception component 1302 and the transmission component 1304. As further shown, the apparatus 1300 may include a communication manager 1308. The communication manager 1308 may include a generation component 1310, among other examples.

In some aspects, the apparatus 1300 may be configured to perform one or more operations described herein in connection with FIGS. 7 and 8. Additionally, or alternatively, the apparatus 1300 may be configured to perform one or more processes described herein, such as process 900 of FIG. 9, process 1100 of FIG. 11, or a combination thereof. In some aspects, the apparatus 1300 and/or one or more components shown in FIG. 13 may include one or more components of the UE described in connection with FIG. 2. Additionally, or alternatively, one or more components shown in FIG. 13 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 1302 may receive communications, such as reference signals, control information, data communications, or a combination thereof, from the apparatus 1306. The reception component 1302 may provide received communications to one or more other components of the apparatus 1300. In some aspects, the reception component 1302 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 1300. In some aspects, the reception component 1302 may include one or more antennas, a modem, a demodulator, a MIMO detector, a receive processor, a controller/processor, a memory, or a combination thereof, of the UE described in connection with FIG. 2.

The transmission component 1304 may transmit communications, such as reference signals, control information, data communications, or a combination thereof, to the apparatus 1306. In some aspects, one or more other components of the apparatus 1300 may generate communications and may provide the generated communications to the transmission component 1304 for transmission to the apparatus 1306. In some aspects, the transmission component 1304 may perform signal processing on the generated communications (such as filtering, amplification, modulation, digital-to-analog conversion, multiplexing, interleaving, mapping, or encoding, among other examples), and may transmit the processed signals to the apparatus 1306. In some aspects, the transmission component 1304 may include one or more antennas, a modem, a modulator, a transmit MIMO processor, a transmit processor, a controller/processor, a memory, or a combination thereof, of the UE described in connection with FIG. 2. In some aspects, the transmission component 1304 may be co-located with the reception component 1302 in a transceiver.

In some examples, means for transmitting, outputting, or sending (or means for outputting for transmission) may include one or more antennas, a modulator, a transmit MIMO processor, a transmit processor, or a combination thereof, of the UE described above in connection with FIG. 2.

In some examples, means for receiving (or means for obtaining) may include one or more antennas, a demodulator, a MIMO detector, a receive processor, or a combination thereof, of the UE described above in connection with FIG. 2.

In some cases, rather than actually transmitting, for example, signals and/or data, a device may have an interface to output signals and/or data for transmission (a means for outputting). For example, a processor may output signals and/or data, via a bus interface, to an RF front end for transmission. Similarly, rather than actually receiving signals and/or data, a device may have an interface to obtain the signals and/or data received from another device (a means for obtaining). For example, a processor may obtain (or receive) the signals and/or data, via a bus interface, from an RF front end for reception. In various aspects, an RF front end may include various components, including transmit and receive processors, transmit and receive MIMO processors, modulators, demodulators, and the like, such as depicted in the examples in FIG. 2.

In some examples, means for receiving, transmitting, determining, decoding, performing, and/or generating may include various processing system components, such as a receive processor, a transmit processor, a controller/processor, a memory, or a combination thereof, of the UE described above in connection with FIG. 2.

The communication manager 1308 and/or the reception component 1302 may receive a reference signal for estimation of at least one parameter associated with generation of an adapted LDPC graph. In some aspects, the communication manager 1308 may include one or more antennas, a modem, a controller/processor, a memory, or a combination thereof, of the UE described in connection with FIG. 2. In some aspects, the communication manager 1308 may include the reception component 1302 and/or the transmission component 1304. In some aspects, the communication manager 1308 may be, be similar to, include, or be included in, the communication manager 140 depicted in FIGS. 1 and 2. The communication manager 1308 and/or the transmission component 1304 may transmit an indication of an adapted LDPC graph that is based on at least one adaptation metric associated with the at least one parameter. The communication manager 1308 and/or the reception component 1302 may receive, based on the adapted LDPC graph, a downlink shared channel communication.

The communication manager 1308 and/or the generation component 1310 may generate the adapted LDPC graph based on the at least one adaptation metric. In some aspects, the generation component 1310 may include one or more antennas, a modem, a controller/processor, a memory, or a combination thereof, of the UE described in connection with FIG. 2. In some aspects, the generation component 1310 may include the reception component 1302 and/or the transmission component 1304.

The communication manager 1308 and/or the transmission component 1304 may transmit an indication of at least one parameter associated with generation of an adapted LDPC graph. The communication manager 1308 and/or the reception component 1302 may receive an indication of an adapted LDPC graph that is based on at least one adaptation metric associated with the at least one parameter. The communication manager 1308 and/or the reception component 1302 may receive, based on the adapted LDPC graph, a downlink shared channel communication. The communication manager 1308 and/or the reception component 1302 may receive a reference signal for estimation of the at least one parameter, wherein the at least one parameter is based on the reference signal. The communication manager 1308 and/or the transmission component 1304 may transmit an SRS, wherein the at least one adaptation metric is based on the SRS. The communication manager 1308 and/or the transmission component 1304 may transmit an indication of a power constraint associated with the UE, wherein the at least one adaptation metric is based on the indication of the power constraint.

The number and arrangement of components shown in FIG. 13 are provided as an example. In practice, there may be additional components, fewer components, different components, or differently arranged components than those shown in FIG. 13. Furthermore, two or more components shown in FIG. 13 may be implemented within a single component, or a single component shown in FIG. 13 may be implemented as multiple, distributed components. Additionally, or alternatively, a set of (one or more) components shown in FIG. 13 may perform one or more functions described as being performed by another set of components shown in FIG. 13.

Figure 14:
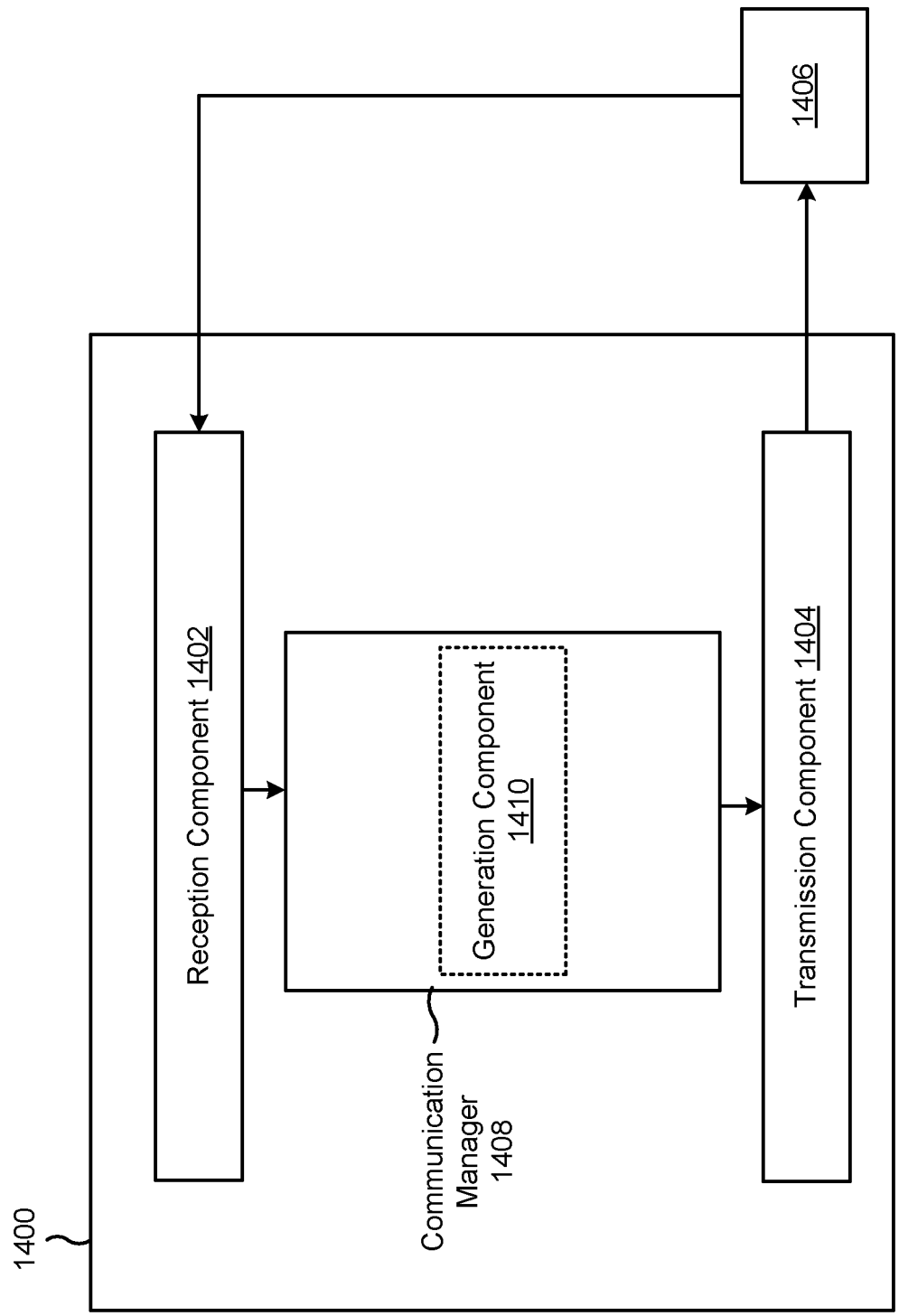
FIG. 14 is a diagram of an example apparatus for wireless communication, in accordance with the present disclosure.

FIG. 14 is a diagram of an example apparatus 1400 for wireless communication, in accordance with the present disclosure. The apparatus 1400 may be a network node, or a network node may include the apparatus 1400. In some aspects, the apparatus 1400 includes a reception component 1402 and a transmission component 1404, which may be in communication with one another (for example, via one or more buses and/or one or more other components). As shown, the apparatus 1400 may communicate with another apparatus 1406 (such as a UE, a base station, or another wireless communication device) using the reception component 1402 and the transmission component 1404. As further shown, the apparatus 1400 may include a communication manager 1408. The communication manager 1408 may include a generation component 1410, among other examples.

In some aspects, the apparatus 1400 may be configured to perform one or more operations described herein in connection with FIGS. 7 and 8. Additionally, or alternatively, the apparatus 1400 may be configured to perform one or more processes described herein, such as process 1000 of FIG. 10, process 1200 of FIG. 12, or a combination thereof. In some aspects, the apparatus 1400 and/or one or more components shown in FIG. 14 may include one or more components of the network node described in connection with FIG. 2. Additionally, or alternatively, one or more components shown in FIG. 14 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 1402 may receive communications, such as reference signals, control information, data communications, or a combination thereof, from the apparatus 1406. The reception component 1402 may provide received communications to one or more other components of the apparatus 1400. In some aspects, the reception component 1402 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 1400. In some aspects, the reception component 1402 may include one or more antennas, a modem, a demodulator, a MIMO detector, a receive processor, a controller/processor, a memory, or a combination thereof, of the network node described in connection with FIG. 2.

The transmission component 1404 may transmit communications, such as reference signals, control information, data communications, or a combination thereof, to the apparatus 1406. In some aspects, one or more other components of the apparatus 1400 may generate communications and may provide the generated communications to the transmission component 1404 for transmission to the apparatus 1406. In some aspects, the transmission component 1404 may perform signal processing on the generated communications (such as filtering, amplification, modulation, digital-to-analog conversion, multiplexing, interleaving, mapping, or encoding, among other examples), and may transmit the processed signals to the apparatus 1406. In some aspects, the transmission component 1404 may include one or more antennas, a modem, a modulator, a transmit MIMO processor, a transmit processor, a controller/processor, a memory, or a combination thereof, of the network node described in connection with FIG. 2. In some aspects, the transmission component 1404 may be co-located with the reception component 1402 in a transceiver.

In some examples, means for transmitting, outputting, or sending (or means for outputting for transmission) may include one or more antennas, a modulator, a transmit MIMO processor, a transmit processor, or a combination thereof, of the network node described above in connection with FIG. 2.

In some examples, means for receiving (or means for obtaining) may include one or more antennas, a demodulator, a MIMO detector, a receive processor, or a combination thereof, of the network node described above in connection with FIG. 2.

In some cases, rather than actually transmitting, for example, signals and/or data, a device may have an interface to output signals and/or data for transmission (a means for outputting). For example, a processor may output signals and/or data, via a bus interface, to an RF front end for transmission. Similarly, rather than actually receiving signals and/or data, a device may have an interface to obtain the signals and/or data received from another device (a means for obtaining). For example, a processor may obtain (or receive) the signals and/or data, via a bus interface, from an RF front end for reception. In various aspects, an RF front end may include various components, including transmit and receive processors, transmit and receive MIMO processors, modulators, demodulators, and the like, such as depicted in the examples in FIG. 2.

In some examples, means for receiving, transmitting, determining, decoding, performing, and/or generating may include various processing system components, such as a receive processor, a transmit processor, a controller/processor, a memory, or a combination thereof, of the network node described above in connection with FIG. 2.

The communication manager 1408 and/or the transmission component 1404 may transmit a reference signal for estimation of at least one parameter associated with generation of an adapted LDPC graph. In some aspects, the communication manager 1408 may include one or more antennas, a modem, a controller/processor, a memory, or a combination thereof, of the network node described in connection with FIG. 2. In some aspects, the communication manager 1408 may include the reception component 1402 and/or the transmission component 1404. In some aspects, the communication manager 1408 may be, be similar to, include, or be included in, the communication manager 150 depicted in FIGS. 1 and 2. The communication manager 1408 and/or the reception component 1402 may receive an indication of an adapted LDPC graph that is based on at least one adaptation metric associated with the at least one parameter. The communication manager 1408 and/or the transmission component 1404 may transmit, based on the adapted LDPC graph, a downlink shared channel communication.

The communication manager 1408 and/or the reception component 1402 may receive an indication of at least one parameter associated with generation of an adapted LDPC graph. The communication manager 1408 and/or the transmission component 1404 may transmit an indication of an adapted LDPC graph that is based on at least one adaptation metric associated with the at least one parameter. The communication manager 1408 and/or the transmission component 1404 may transmit, based on the adapted LDPC graph, a downlink shared channel communication. The communication manager 1408 and/or the transmission component 1404 may transmit a reference signal for estimation of the at least one parameter, wherein the at least one parameter is based on the reference signal.

The communication manager 1408 and/or the generation component 1410 may generate the adapted LDPC graph based on the at least one adaptation metric. In some aspects, the generation component 1410 may include one or more antennas, a modem, a controller/processor, a memory, or a combination thereof, of the network node described in connection with FIG. 2. In some aspects, the generation component 1410 may include the reception component 1402 and/or the transmission component 1404. The communication manager 1408 and/or the reception component 1402 may receive an SRS, wherein the at least one adaptation metric is based on the SRS. The communication manager 1408 and/or the reception component 1402 may receive an indication of a power constraint associated with a user equipment, wherein the at least one adaptation metric is based on the indication of the power constraint.

The number and arrangement of components shown in FIG. 14 are provided as an example. In practice, there may be additional components, fewer components, different components, or differently arranged components than those shown in FIG. 14. Furthermore, two or more components shown in FIG. 14 may be implemented within a single component, or a single component shown in FIG. 14 may be implemented as multiple, distributed components. Additionally, or alternatively, a set of (one or more) components shown in FIG. 14 may perform one or more functions described as being performed by another set of components shown in FIG. 14.

The following provides an overview of some Aspects of the present disclosure:

Aspect 1: A method of wireless communication performed by a user equipment (UE), comprising: receiving a reference signal for estimation of at least one parameter associated with generation of an adapted low density parity check (LDPC) graph; transmitting an indication of an adapted LDPC graph that is based on at least one adaptation metric associated with the at least one parameter; and receiving, based on the adapted LDPC graph, a downlink shared channel communication.

Aspect 2: The method of Aspect 1, wherein receiving the downlink shared channel communication comprises decoding, based on the adapted LDPC graph, the downlink shared channel communication.

Aspect 3: The method of either of claim 1 or 2, wherein the reference signal comprises at least one of a channel state information-reference signal (CSI-RS) or a demodulation reference signal (DMRS).

Aspect 4: The method of any of Aspects 1-3, wherein the at least one parameter indicates at least one of a channel estimation, a power delay profile estimation, a signal to noise ratio (SNR) estimation, or a signal to interference plus noise ratio (SINR) estimation.

Aspect 5: The method of any of Aspects 1-4, further comprising generating the adapted LDPC graph based on the at least one adaptation metric.

Aspect 6: The method of Aspect 5, wherein generating the adapted LDPC graph comprises generating the adapted LDPC graph based on a machine-learning operation.

Aspect 7: The method of Aspect 6, wherein generating the adapted LDPC graph comprises performing the machine-learning operation using at least one neural network to optimize the at least one adaptation metric based on the at least one parameter.

Aspect 8: The method of any of Aspects 5-7, wherein generating the adapted LDPC graph comprises generating the adapted LDPC graph based on at least one of a static optimization procedure or a semi-static optimization procedure.

Aspect 9: The method of any of Aspects 1-8, wherein the at least one adaptation metric comprises at least one of a power constraint metric, a code rate, a hybrid automatic repeat request (HARQ) mechanism use metric, or a channel condition metric.

Aspect 10: The method of any of Aspects 1-9, wherein the adapted LDPC graph is based on a quasi-cyclic LDPC (QC-LDPC) configuration.

Aspect 11: The method of Aspect 10, wherein the adapted LDPC graph is based on the QC-LDPC configuration based on a code block size of a code block corresponding to the indication satisfying a code block size threshold.

Aspect 12: The method of any of Aspects 1-11, wherein transmitting the indication comprises transmitting an LDPC parity check matrix request, the method further comprising receiving an indication of application of the LDPC request.

Aspect 13: A method of wireless communication performed by a network node, comprising: transmitting a reference signal for estimation of at least one parameter associated with generation of an adapted low density parity check (LDPC) graph; receiving an indication of an adapted LDPC graph that is based on at least one adaptation metric associated with the at least one parameter; and transmitting, based on the adapted LDPC graph, a downlink shared channel communication.

Aspect 14: The method of Aspect 13, wherein the reference signal comprises at least one of a channel state information-reference signal (CSI-RS) or a demodulation reference signal (DMRS).

Aspect 15: The method of either of claim 13 or 14, wherein the at least one parameter indicates at least one of a channel estimation, a power delay profile estimation, a signal to noise ratio (SNR) estimation, or a signal to interference plus noise ratio (SINR) estimation.

Aspect 16: The method of any of Aspects 13-15, wherein the adapted LDPC graph is based on a machine-learning operation.

Aspect 17: The method of Aspect 16, wherein the machine-learning operation comprises an optimization procedure associated with at least one neural network configured to optimize the at least one adaptation metric based on the at least one parameter.

Aspect 18: The method of either of claim 16 or 17, wherein the adapted LDPC graph is based on at least one of a static optimization procedure or a semi-static optimization procedure.

Aspect 19: The method of any of Aspects 13-18, wherein the at least one adaptation metric comprises at least one of a power constraint metric, a code rate, a hybrid automatic repeat request (HARQ) mechanism use metric, or a channel condition metric.

Aspect 20: The method of any of Aspects 13-19, wherein the adapted LDPC graph is based on a quasi-cyclic LDPC (QC-LDPC) configuration.

Aspect 21: The method of Aspect 20, wherein the adapted LDPC graph is based on the QC-LDPC configuration based on a code block size of a code block corresponding to the indication satisfying a code block size threshold.

Aspect 22: The method of any of Aspects 13-21, wherein receiving the indication comprises receiving an LDPC parity check matrix request, the method further comprising transmitting an indication of application of the LDPC request.

Aspect 23: A method of wireless communication performed by a user equipment (UE), comprising: transmitting an indication of at least one parameter associated with generation of an adapted low density parity check (LDPC) graph; receiving an indication of an adapted LDPC graph that is based on at least one adaptation metric associated with the at least one parameter; and receiving, based on the adapted LDPC graph, a downlink shared channel communication.

Aspect 24: The method of Aspect 23, wherein receiving the downlink shared channel communication comprises decoding, based on the adapted LDPC graph, the downlink shared channel communication.

Aspect 25: The method of either of claim 23 or 24, further comprising receiving a reference signal for estimation of the at least one parameter, wherein the at least one parameter is based on the reference signal.

Aspect 26: The method of Aspect 25, wherein the reference signal comprises at least one of a channel state information-reference signal (CSI-RS) or a demodulation reference signal (DMRS).

Aspect 27: The method of any of Aspects 23-26, wherein the at least one parameter indicates at least one of a channel estimation, a power delay profile estimation, a signal to noise ratio (SNR) estimation, or a signal to interference plus noise ratio (SINR) estimation.

Aspect 28: The method of any of Aspects 23-27, wherein the adapted LDPC graph is based on a machine-learning operation.

Aspect 29: The method of Aspect 28, wherein the machine-learning operation comprises an optimization procedure associated with at least one neural network configured to optimize the at least one adaptation metric based on the at least one parameter.

Aspect 30: The method of any of Aspects 23-29, wherein the adapted LDPC graph is based on at least one of a static optimization procedure or a semi-static optimization procedure.

Aspect 31: The method of any of Aspects 23-30, wherein the at least one adaptation metric comprises at least one of a power constraint metric, a code rate, a hybrid automatic repeat request (HARQ) mechanism use metric, or a channel condition metric.

Aspect 32: The method of any of Aspects 23-31, wherein the adapted LDPC graph is based on a quasi-cyclic LDPC (QC-LDPC) configuration.

Aspect 33: The method of Aspect 32, wherein the adapted LDPC graph is based on the QC-LDPC configuration based on a code block size of a code block corresponding to the indication satisfying a code block size threshold.

Aspect 34: The method of any of Aspects 23-33, wherein receiving the indication comprises receiving an indication of an LDPC parity check matrix.

Aspect 35: The method of any of Aspects 23-34, further comprising transmitting a sounding reference signal (SRS), wherein the at least one adaptation metric is based on the SRS.

Aspect 36: The method of any of Aspects 23-35, further comprising transmitting an indication of a power constraint associated with the UE, wherein the at least one adaptation metric is based on the indication of the power constraint.

Aspect 37: A method of wireless communication performed by a network node, comprising: receiving an indication of at least one parameter associated with generation of an adapted low density parity check (LDPC) graph; transmitting an indication of an adapted LDPC graph that is based on at least one adaptation metric associated with the at least one parameter; and transmitting, based on the adapted LDPC graph, a downlink shared channel communication.

Aspect 38: The method of Aspect 37, further comprising transmitting a reference signal for estimation of the at least one parameter, wherein the at least one parameter is based on the reference signal.

Aspect 39: The method of Aspect 38, wherein the reference signal comprises at least one of a channel state information-reference signal (CSI-RS) or a demodulation reference signal (DMRS).

Aspect 40: The method of any of Aspects 37-39, wherein the at least one parameter indicates at least one of a channel estimation, a power delay profile estimation, a signal to noise ratio (SNR) estimation, or a signal to interference plus noise ratio (SINR) estimation.

Aspect 41: The method of any of Aspects 37-40, further comprising generating the adapted LDPC graph based on the at least one adaptation metric.

Aspect 42: The method of Aspect 41, wherein generating the adapted LDPC graph comprises generating the adapted LDPC graph based on a machine-learning operation.

Aspect 43: The method of Aspect 42, wherein generating the adapted LDPC graph comprises performing the machine-learning operation using at least one neural network to optimize the at least one adaptation metric based on the at least one parameter.

Aspect 44: The method of any of Aspects 41-43, wherein generating the adapted LDPC graph comprises generating the adapted LDPC graph based on at least one of a static optimization procedure or a semi-static optimization procedure.

Aspect 45: The method of any of Aspects 37-44, wherein the at least one adaptation metric comprises at least one of a power constraint metric, a code rate, a hybrid automatic repeat request (HARQ) mechanism use metric, or a channel condition metric.

Aspect 46: The method of any of Aspects 37-45, wherein the adapted LDPC graph is based on a quasi-cyclic LDPC (QC-LDPC) configuration.

Aspect 47: The method of Aspect 46, wherein the adapted LDPC graph is based on the QC-LDPC configuration based on a code block size of a code block corresponding to the indication satisfying a code block size threshold.

Aspect 48: The method of any of Aspects 37-47, wherein transmitting the indication comprises transmitting an indication of an LDPC parity check matrix.

Aspect 49: The method of any of Aspects 37-48, further comprising receiving a sounding reference signal (SRS), wherein the at least one adaptation metric is based on the SRS.

Aspect 50: The method of any of Aspects 37-49, further comprising receiving an indication of a power constraint associated with a user equipment, wherein the at least one adaptation metric is based on the indication of the power constraint.

Aspect 51: An apparatus for wireless communication at a device, comprising a processor; memory coupled with the processor; and instructions stored in the memory and executable by the processor to cause the apparatus to perform the method of one or more of Aspects 1-12.

Aspect 52: A device for wireless communication, comprising a memory and one or more processors coupled to the memory, the one or more processors configured to perform the method of one or more of Aspects 1-12.

Aspect 53: An apparatus for wireless communication, comprising at least one means for performing the method of one or more of Aspects 1-12.

Aspect 54: A non-transitory computer-readable medium storing code for wireless communication, the code comprising instructions executable by a processor to perform the method of one or more of Aspects 1-12.

Aspect 55: A non-transitory computer-readable medium storing a set of instructions for wireless communication, the set of instructions comprising one or more instructions that, when executed by one or more processors of a device, cause the device to perform the method of one or more of Aspects 1-12.

Aspect 56: An apparatus for wireless communication at a device, comprising a processor; memory coupled with the processor; and instructions stored in the memory and executable by the processor to cause the apparatus to perform the method of one or more of Aspects 13-22.

Aspect 57: A device for wireless communication, comprising a memory and one or more processors coupled to the memory, the one or more processors configured to perform the method of one or more of Aspects 13-22.

Aspect 58: An apparatus for wireless communication, comprising at least one means for performing the method of one or more of Aspects 13-22.

Aspect 59: A non-transitory computer-readable medium storing code for wireless communication, the code comprising instructions executable by a processor to perform the method of one or more of Aspects 13-22.

Aspect 60: A non-transitory computer-readable medium storing a set of instructions for wireless communication, the set of instructions comprising one or more instructions that, when executed by one or more processors of a device, cause the device to perform the method of one or more of Aspects 13-22.

Aspect 61: An apparatus for wireless communication at a device, comprising a processor; memory coupled with the processor; and instructions stored in the memory and executable by the processor to cause the apparatus to perform the method of one or more of Aspects 23-36.

Aspect 62: A device for wireless communication, comprising a memory and one or more processors coupled to the memory, the one or more processors configured to perform the method of one or more of Aspects 23-36.

Aspect 63: An apparatus for wireless communication, comprising at least one means for performing the method of one or more of Aspects 23-36.

Aspect 64: A non-transitory computer-readable medium storing code for wireless communication, the code comprising instructions executable by a processor to perform the method of one or more of Aspects 23-36.

Aspect 65: A non-transitory computer-readable medium storing a set of instructions for wireless communication, the set of instructions comprising one or more instructions that, when executed by one or more processors of a device, cause the device to perform the method of one or more of Aspects 23-36.

Aspect 66: An apparatus for wireless communication at a device, comprising a processor; memory coupled with the processor; and instructions stored in the memory and executable by the processor to cause the apparatus to perform the method of one or more of Aspects 37-50.

Aspect 67: A device for wireless communication, comprising a memory and one or more processors coupled to the memory, the one or more processors configured to perform the method of one or more of Aspects 37-50.

Aspect 68: An apparatus for wireless communication, comprising at least one means for performing the method of one or more of Aspects 37-50.

Aspect 69: A non-transitory computer-readable medium storing code for wireless communication, the code comprising instructions executable by a processor to perform the method of one or more of Aspects 37-50.

Aspect 70: A non-transitory computer-readable medium storing a set of instructions for wireless communication, the set of instructions comprising one or more instructions that, when executed by one or more processors of a device, cause the device to perform the method of one or more of Aspects 37-50.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a "processor" is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods are described herein without reference to specific software code, since those skilled in the art will understand that software and hardware can be designed to implement the systems and/or methods based, at least in part, on the description herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. Many of these features may be combined in ways not specifically recited in the claims and/or disclosed in the specification. The disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A user equipment (UE) for wireless communication, comprising:
   a memory; and
   one or more processors coupled to the memory and configured to cause the UE to:
      receive a reference signal for estimation of at least one parameter associated with generation of a low density parity check (LDPC) graph;
      transmit an indication of an adapted LDPC graph that is based on a machine-learning operation and at least one adaptation metric associated with the at least one parameter; and
      receive, based on the adapted LDPC graph, a downlink shared channel communication.

2. The UE of claim 1, wherein the one or more processors, to cause the UE to receive the downlink shared channel communication, are configured to cause the UE to decode, based on the adapted LDPC graph, the downlink shared channel communication.

3. The UE of claim 1, wherein the reference signal comprises at least one of a channel state information-reference signal (CSI-RS) or a demodulation reference signal (DMRS).

4. The UE of claim 1, wherein the at least one parameter indicates at least one of a channel estimation, a power delay profile estimation, a signal to noise ratio (SNR) estimation, or a signal to interference plus noise ratio (SINR) estimation.

5. The UE of claim 1, wherein the one or more processors are further configured to cause the UE to generate the adapted LDPC graph based on the at least one adaptation metric.

6. The UE of claim 5, wherein the one or more processors, to cause the UE to generate the adapted LDPC graph, are configured to cause the UE to perform the machine-learning operation using at least one neural network to optimize the at least one adaptation metric based on the at least one parameter.

7. The UE of claim 5, wherein the one or more processors, to cause the UE to generate the adapted LDPC graph, are configured to cause the UE to generate the adapted LDPC graph based on at least one of a static optimization procedure or a semi-static optimization procedure.

8. The UE of claim 1, wherein the at least one adaptation metric comprises at least one of a power constraint metric, a code rate, a hybrid automatic repeat request (HARQ) mechanism use metric, or a channel condition metric.

9. The UE of claim 1, wherein the adapted LDPC graph is based on a quasi-cyclic LDPC (QC-LDPC) configuration.

10. The UE of claim 9, wherein the adapted LDPC graph is based on the QC-LDPC configuration based on a code block size of a code block corresponding to the indication satisfying a code block size threshold.

11. The UE of claim 1, wherein the one or more processors, to cause the UE to transmit the indication, are configured to cause the UE to transmit an LDPC parity check matrix request, and wherein the one or more processors are further configured to cause the UE to receive an indication of application of the LDPC request.

12. A network node for wireless communication, comprising:
   a memory; and
   one or more processors coupled to the memory and configured to cause the network node to:
      transmit a reference signal for estimation of at least one parameter associated with generation of a low density parity check (LDPC) graph;
      receive an indication of an adapted LDPC graph that is based on a machine-learning operation and at least one adaptation metric associated with the at least one parameter; and
      transmit, based on the adapted LDPC graph, a downlink shared channel communication.

13. The network node of claim 12, wherein the at least one adaptation metric comprises at least one of a power constraint metric, a code rate, a hybrid automatic repeat request (HARQ) mechanism use metric, or a channel condition metric.

14. The network node of claim 12, wherein the reference signal comprises at least one of a channel state information-reference signal (CSI-RS) or a demodulation reference signal (DMRS).

15. The network node of claim 12, wherein the adapted LDPC graph is based on a quasi-cyclic LDPC (QC-LDPC) configuration.

16. The network node of claim 15, wherein the adapted LDPC graph is based on the QC-LDPC configuration based on a code block size of a code block corresponding to the indication satisfying a code block size threshold.

17. A user equipment (UE) for wireless communication, comprising:
   a memory; and
   one or more processors coupled to the memory and configured to cause the UE to:

transmit an indication of at least one parameter associated with generation of a low density parity check (LDPC) graph;

receive an indication of an adapted LDPC graph that is based on a machine-learning operation and at least one adaptation metric associated with the at least one parameter; and receive, based on the adapted LDPC graph, a downlink shared channel communication.

18. The UE of claim 17, wherein the one or more processors, to cause the UE to receive the downlink shared channel communication, are configured to cause the UE to decode, based on the adapted LDPC graph, the downlink shared channel communication.

19. The UE of claim 17, wherein the one or more processors are further configured to cause the UE to receive a reference signal for estimation of the at least one parameter, wherein the at least one parameter is based on the reference signal.

20. The UE of claim 17, wherein the at least one parameter indicates at least one of a channel estimation, a power delay profile estimation, a signal to noise ratio (SNR) estimation, or a signal to interference plus noise ratio (SINR) estimation.

21. The UE of claim 17, wherein the machine-learning operation comprises an optimization procedure associated with at least one neural network configured to optimize the at least one adaptation metric based on the at least one parameter.

22. The UE of claim 17, wherein the adapted LDPC graph is based on at least one of a static optimization procedure or a semi-static optimization procedure.

23. The UE of claim 17, wherein the at least one adaptation metric comprises at least one of a power constraint metric, a code rate, a hybrid automatic repeat request (HARQ) mechanism use metric, or a channel condition metric.

24. The UE of claim 17, wherein the adapted LDPC graph is based on a quasi-cyclic LDPC (QC-LDPC) configuration.

25. The UE of claim 24, wherein the adapted LDPC graph is based on the QC-LDPC configuration based on a code block size of a code block corresponding to the indication satisfying a code block size threshold.

26. The UE of claim 17, wherein the one or more processors, to cause the UE to receive the indication, are configured to cause the UE to receive an indication of an LDPC parity check matrix.

27. The UE of claim 17, wherein the one or more processors are further configured to cause the UE to transmit a sounding reference signal (SRS), wherein the at least one adaptation metric is based on the SRS.

28. The UE of claim 17, wherein the one or more processors are further configured to cause the UE to transmit an indication of a power constraint associated with the UE, wherein the at least one adaptation metric is based on the indication of the power constraint.

29. A network node for wireless communication, comprising:

a memory; and one or more processors coupled to the memory and configured to cause the network node to:

receive an indication of at least one parameter associated with generation of an adapted low density parity check (LDPC) graph;

transmit an indication of an adapted LDPC graph that is based on a machine-learning operation and at least one adaptation metric associated with the at least one parameter; and transmit, based on the adapted LDPC graph, a downlink shared channel communication.

30. The network node of claim 29, wherein the one or more processors are further configured to cause the network node to generate the adapted LDPC graph based on the machine-learning operation.

* * * * *